United States Patent
Tomita et al.

(10) Patent No.: US 7,985,683 B2
(45) Date of Patent: *Jul. 26, 2011

(54) METHOD OF TREATING A SEMICONDUCTOR SUBSTRATE

(75) Inventors: Hiroshi Tomita, Yokohama (JP); Tatsuhiko Koide, Yokohama (JP); Hisashi Okuchi, Yokohama (JP); Kentaro Shimayama, Yokohama (JP); Hiroyasu Iimori, Yokohama (JP); Linan Ji, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/801,178

(22) Filed: May 26, 2010

(65) Prior Publication Data

US 2010/0240219 A1 Sep. 23, 2010

Related U.S. Application Data

(60) Division of application No. 12/574,543, filed on Oct. 6, 2009, now Pat. No. 7,749,909, which is a continuation-in-part of application No. 12/257,493, filed on Oct. 24, 2008, now Pat. No. 7,838,425.

(30) Foreign Application Priority Data

Oct. 6, 2008 (JP) .................................. 2008-259636
Jun. 12, 2009 (JP) .................................. 2009-140992

(51) Int. Cl.
*H01L 21/312* (2006.01)
(52) U.S. Cl. ................. 438/694; 438/964; 257/E21.228
(58) Field of Classification Search .................. 438/694, 438/964, FOR. 388; 257/E21.228
See application file for complete search history.

(56) References Cited

U.S. PATENT DOCUMENTS

| 6,620,260 | B2 | 9/2003 | Kumagai et al. |
| 6,727,163 | B2 | 4/2004 | Kim et al. |
| 6,858,089 | B2 | 2/2005 | Castrucci |
| 7,163,018 | B2 | 1/2007 | Verhaverbeke et al. |
| 7,659,201 | B2 | 2/2010 | Ohashi et al. |
| 2002/0189643 | A1 | 12/2002 | Chen et al. |
| 2005/0205126 | A1 | 9/2005 | Okui et al. |
| 2006/0278254 | A1 | 12/2006 | Jackson |
| 2007/0102021 | A1 | 5/2007 | Nappa et al. |
| 2008/0002162 | A1 | 1/2008 | Jansen et al. |
| 2008/0020498 | A1 | 1/2008 | Okamoto et al. |

(Continued)

FOREIGN PATENT DOCUMENTS

| JP | 7-142349 | 6/1995 |
| JP | 2004-140321 | 5/2004 |

(Continued)

OTHER PUBLICATIONS

Notification of Reasons for Rejection issued by the Japanese Patent Office on Jul. 10, 2009, for Japanese Patent Application No. 2009-140992, and English-language translation thereof.

(Continued)

*Primary Examiner* — George Fourson
(74) *Attorney, Agent, or Firm* — Finnegan, Henderson, Farabow, Garrett & Dunner, L.L.P.

(57) ABSTRACT

A method of treating a semiconductor substrate has forming convex patterns over the semiconductor substrate by dry etching, cleaning and modifying a surface of the convex patterns by using chemical, forming a hydrophobic functional surface on the modified surface of the convex patterns, after forming the hydrophobic functional surface, rinsing the semiconductor substrate by using water, drying the semiconductor substrate, and removing the hydrophobic functional group from the hydrophobic functional surface of the convex patterns.

30 Claims, 15 Drawing Sheets

U.S. PATENT DOCUMENTS

2008/0207005 A1 8/2008 Farkas
2009/0255558 A1 10/2009 Inukai et al.

FOREIGN PATENT DOCUMENTS

| JP | 2005-203563 | 7/2005 |
|----|-------------|--------|
| JP | 3866130 | 10/2006 |
| JP | 2008-16780 | 1/2008 |

OTHER PUBLICATIONS

The Notification of Reasons for Rejection issued by the Japanese Patent Office on Nov. 20, 2009, for Japanese Patent Application No. 2009-243777.

Notification of Reasons for Rejection issued by the Korean Intellectual Property Office on Feb. 11, 2011, for Korean Patent Application No. 10-2009-52862, and English-language translation thereof.

FIG. 4

METHOD OF TREATING A SEMICONDUCTOR SUBSTRATE

CROSS REFERENCE TO RELATED APPLICATIONS

This is a divisional application of U.S. patent application Ser. No. 12/574,543, now U.S. Pat. No. 7,749,909, which is a continuation-in-part of U.S. patent application Ser. No. 12/257,493, filed Oct. 24, 2008, now U.S. Pat. No. 7,838,425, all of which are incorporated herein by reference.

This application is based upon and claims benefit of priority from the Japanese Patent Application No. 2008-259636, filed on Oct. 6, 2008, and the Japanese Patent Application No. 2009-140992, filed on Jun. 12, 2009, the entire contents of which are incorporated herein by reference.

BACKGROUND OF THE INVENTION

The present invention relates to a method of treating a semiconductor substrate.

In a manufacturing process of a semiconductor device, there are included various processes such as a lithography process, an etching process, an ion implanting process and the like. Before moving into the next process after finishing each of the processes, there is executed a cleaning (washing) process and a drying process for removing an impurity and residue remaining on a wafer surface so as to make the wafer surface clean.

In recent years, in accordance that a critical dimension is miniaturized, there has been generated a problem that a resist pattern collapses due to a capillary phenomenon upon developing and drying the resist pattern after the lithography process (exposure and development). In order to solve the problem mentioned above, there has been proposed a method of making the surface of the resist pattern hydrophobic surface so as to lower capillary force acting between the resist pattern, and developing solution and rinsing pure water (refer, for example, to Japanese Patent Application Laid-open No. 7-142349). In this method, an organic material adheres on the surface of the resist pattern, however, the organic material is removed together with the resist pattern in an dry etching process after the lithography process.

Further, in a cleaning treatment of a semiconductor wafer after the dry etching process, a chemical solution for the cleaning treatment is supplied to the surface of the wafer, and thereafter a rinse treatment is performed by supplying pure water to the surface of the wafer. After the rinse treatment, there is performed a drying treatment for removing the pure water left on the wafer surface and for drying the wafer. As a method for performing the drying treatment, there is, for example, a method of drying the wafer in such a manner that IPA (isopropyl alcohol) is used to substitute the pure water on the wafer with IPA (refer, for example, to Japanese Patent No. 3866130). However, there is a problem that a pattern formed on the wafer is collapsed by the surface tension of the solution during the drying treatment.

Further, even if Hydrofluoroether (HFE) having lower surface tension than the IPA is used, it has been difficult to suppress the pattern collapse. In order to solve the problem mentioned above, there has been proposed supercritical $CO_2$ drying by which the surface tension comes to zero. However, the supercritical $CO_2$ drying is difficult to be applied to mass production process, and in the case that water content or the like is brought into a chamber achieving a supercritical atmosphere, there has been a problem that it is impossible to prevent the pattern from collapsing.

SUMMARY OF THE INVENTION

According to one aspect of the present invention, there is provided a method of treating a semiconductor substrate comprising:

forming convex patterns over the semiconductor substrate by dry etching;

cleaning and modifying a surface of the convex patterns by using chemical;

forming a hydrophobic functional surface on the modified surface of the convex patterns;

after forming the hydrophobic functional surface, rinsing the semiconductor substrate by using water;

drying the semiconductor substrate; and removing the hydrophobic functional group from the hydrophobic functional surface of the convex patterns.

According to one aspect of the present invention, there is provided a method of treating a semiconductor substrate comprising:

forming convex patterns over the semiconductor substrate by dry etching;

cleaning a surface of the convex patterns by using first chemical;

modifying the surface of the convex patterns by using second chemical;

forming a hydrophobic functional surface on the modified surface of the convex patterns;

after forming the hydrophobic functional surface, rinsing the semiconductor substrate by using water;

drying the semiconductor substrate; and removing the hydrophobic functional group from the hydrophobic functional surface of the convex patterns.

BRIEF DESCRIPTION OF THE DRAWINGS

FIG. 4 is a figure showing pattern states after drying treatments performed in the cases where the water repellent protective film (a hydrophobic functional surface) was formed, and where it was not formed;

DESCRIPTION OF THE EMBODIMENTS

An object to be performed in the washing process in the manufacturing process of a semiconductor device is to return a semiconductor substrate surface to a clean surface state without generating any defect (missing pattern, scratch, thinned pattern, dug substrate, or the like) in a fine pattern structure formed on a semiconductor substrate. Specifically, target matters to be washed includes resist material used in a lithography process, a reaction by-product (residue) remaining on a semiconductor wafer surface in a dry etching process, and metallic impurity, organic contaminant or the like, these processes are generally employed in a semiconductor manufacturing process. If the wafer is flown to the following manufacturing process while leaving the target materials to be washed, a device manufacturing yield ratio has to be lowered.

Accordingly, the cleaning process has an important role of forming a clean semiconductor wafer surface after cleaning without generating any defect (missing pattern, scratch, thinned pattern, dug substrate, or the like) in a fine pattern structure formed on the semiconductor substrate. As an element is miniaturized, cleanliness demanded in the cleaning process becomes higher.

On the other hand, in a recent structure in which a convex fine pattern of high aspect is provided (for example, a structure having pattern size of 30 nm or less, and an aspect ratio of 10 or more), since hydrophobic force is insufficient only by applying hydrophobic technique which is used in the resist process, it has been difficult to suppress collapse of the pattern. Further, there has been a problem with this method that the pattern surface is contaminated. In accordance with the following embodiment, it is possible to achieve higher hydrophobic contact than the conventional one and to suppress the pattern collapse, while keeping the pattern surface clean, with respect to the structure having the convex fine pattern of high aspect.

First Embodiment

Figure 1:
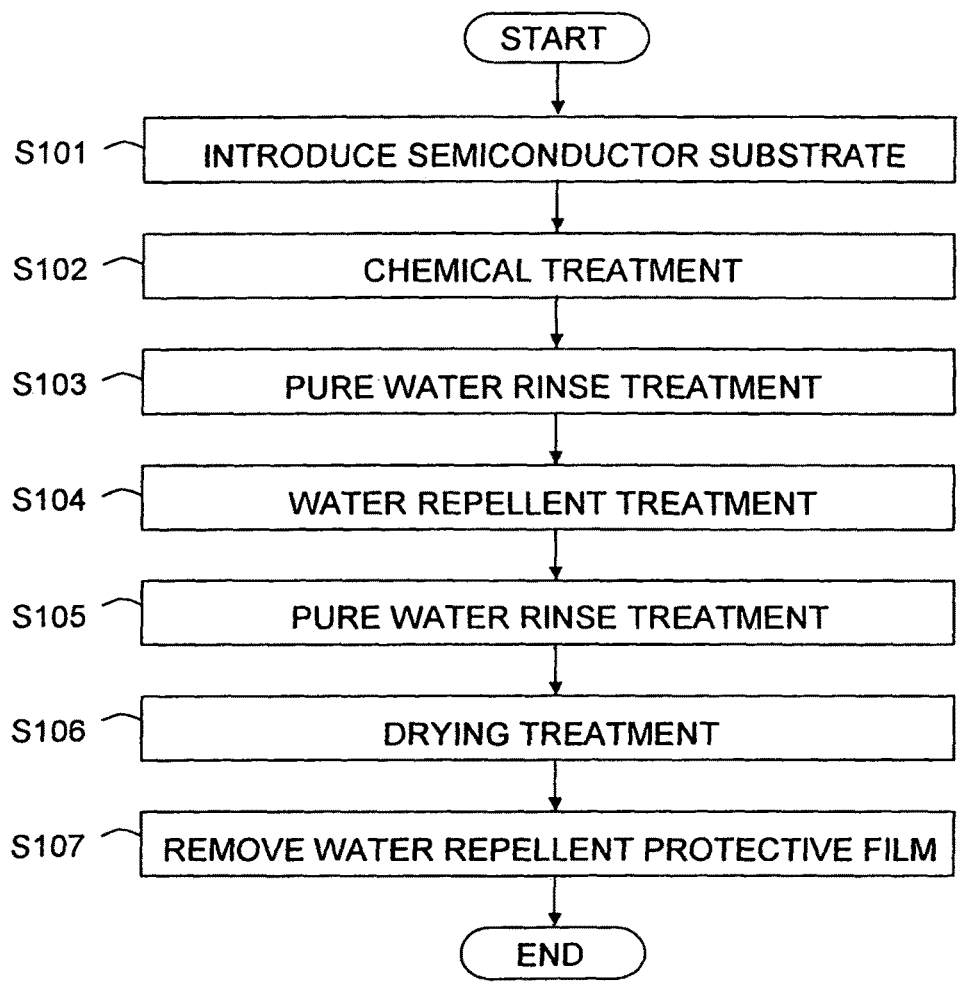
FIG. 1 is a flow chart for explaining a surface treatment method according to a first embodiment and a fourth embodiment.
Figure 2:
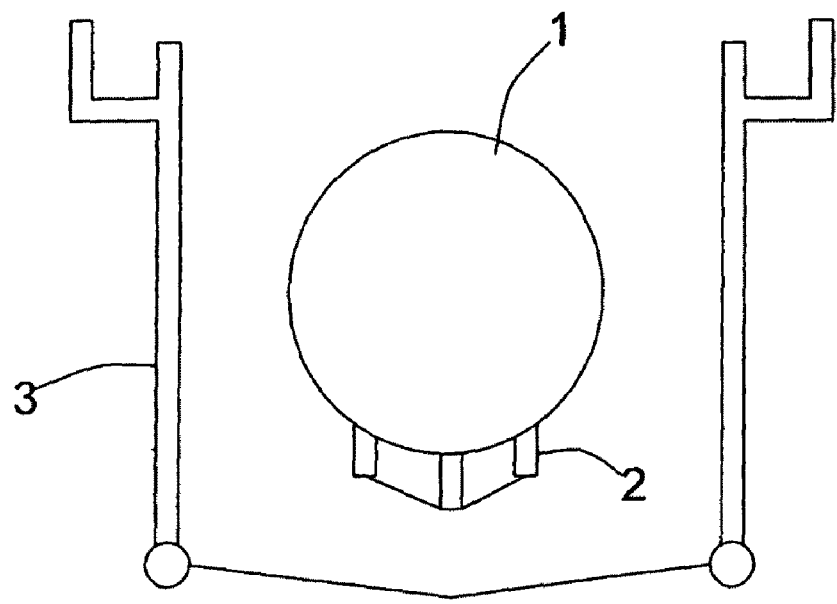
FIG. 2 is a figure showing a schematic configuration of a surface treatment apparatus according to the first embodiment and the fourth embodiment.

A method of treating the surface of a semiconductor substrate, according to a first embodiment of the present invention, will be described with reference to a flow chart shown in FIG. 1 and a sectional view of a main part of a surface treatment apparatus shown FIG. 2. The surface treatment apparatus shown in FIG. 2 is a batch type apparatus configured to collectively perform cleaning and drying of a plurality of semiconductor substrates.

(Step S101) A patterned semiconductor substrate (wafer) 1 is held by a substrate holding section 2, and is introduced into a treatment tank 3.

(Step S102) The semiconductor substrate 1 is cleaned by supplying a chemical solution from a treatment chemical solution supplying section (not shown) to the treatment tank 3. As the chemical solution, there is used a mixed solution (SPM) of sulfuric acid and aqueous hydrogen peroxide.

(Step S103) The semiconductor substrate 1 is rinsed by supplying pure water from the treatment chemical solution supplying section to the treatment tank 3, so that components of the chemical solution used in step S102 are removed.

(Step S104) A surfactant (water soluble surfactant) is supplied to the treatment tank 3 from the treatment chemical solution supplying section, so that a low-wettability protective film (a hydrophobic functional surface) is formed on the surface of the semiconductor substrate 1. The surfactant is a substance having both a hydrophobic group and a hydrophilic group in the molecule.

(Step S105) Pure water is supplied to the treatment tank 3 from the treatment chemical solution supplying section, so as to rinse out the remaining surfactant.

(Step S106) A drying treatment of the semiconductor substrate 1 is performed. For example, the semiconductor substrate 1 is pulled up from the treatment tank 3, and is thereafter subjected to evaporation drying by supplying dry air from a gas supplying section (not shown). A reduced pressure drying method may also be used.

Further, the drying treatment may also be performed in such a manner that a drying chemical (IPA or the like) is supplied to the upper space of the treatment tank 3 from a drying chemical supplying section (not shown) in the form of liquid, vapor, or mist and in a non-mixed state or in a state mixed with a gas such as nitrogen, and that the level of the pure water in which the semiconductor substrate 1 is immersed is gradually lowered by draining the pure water. Further, the drying treatment may also be performed by using a solution with low surface tension, such as HFE.

Since a pattern formed on the semiconductor substrate 1 is covered with a hydrophobic functional surface, the contact angle θ of solution is made to become large (close to 90°).

Figure 3:
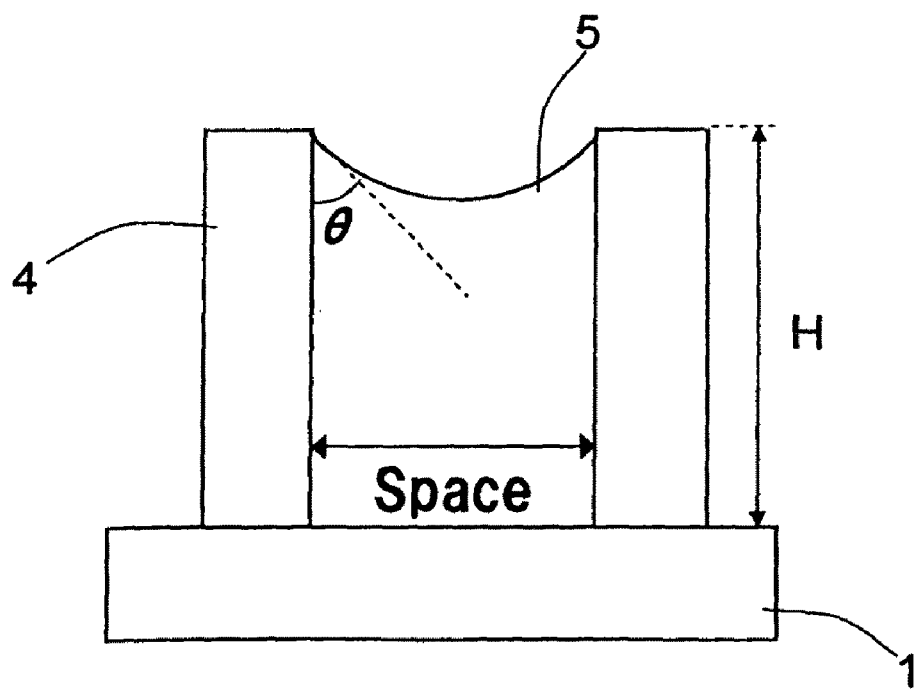
FIG. 3 is a figure for explaining surface tension of a solution, which is applied to a pattern.

FIG. 3 shows a state where a part of patterns 4 formed on the semiconductor substrate 1 is wetted with a solution 5. Here, when a distance between the patterns 4 is defined as Space, and when the surface tension of the solution 5 is defined as γ, the power which contributes to the pattern collapse P applied to the pattern 4 is expressed by the following formula.

$$P = 2 \times \gamma \times H \times \cos\theta / \text{Space} \quad \text{(Formula 1)}$$

It can be seen from the formula that when θ approaches 90°, cos θ approaches zero and hence the power P of the solution, which is applied to the pattern during the drying treatment, is reduced. Thereby, it is possible to prevent the pattern from being collapsed during the drying treatment.

(Step S107) An ashing treatment, such as dry ashing and ozone gas treatments, is performed, so as to remove a hydrophobic functional surface formed on the surface of the semiconductor substrate 1.

Figure 4:
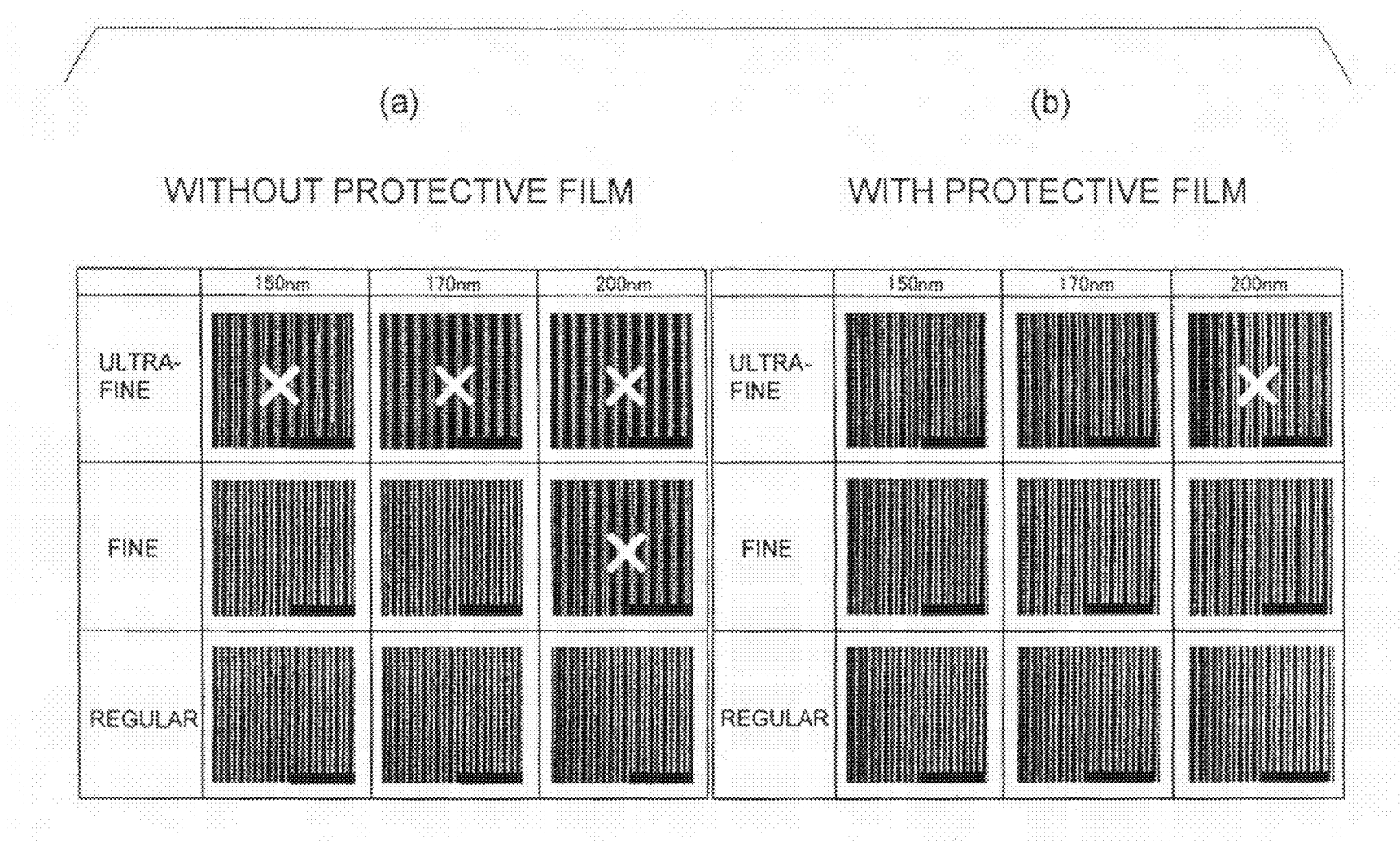

FIG. 4 shows pattern states after the drying treatments performed in the cases where a hydrophobic functional surface was formed, and where it was not formed. The surface treatment was performed for patterns having three heights of 150 nm, 170 nm and 200 nm, and having three line widths of regular, fine and ultra-fine line widths (regular>fine>ultra-fine).

As can be seen from FIG. 4(a), in the case where a hydrophobic functional surface was not formed, the pattern collapse was caused in the ultra-fine line width pattern having any of the heights of 150 nm, 170 nm and 200 nm. Further, the pattern collapse was also caused in the fine line width pattern having the height of 200 nm.

On the other hand, as can be seen from FIG. 4(b), in the case where a hydrophobic functional surface was formed, the pattern collapse was able to be prevented in the ultra-fine line width patterns other than the ultra-fine line width pattern having the height of 200 nm. It is seen that by the formation of a hydrophobic functional surface, the pattern collapse due to cleaning and drying can be prevented even in a pattern with a high aspect ratio and thereby the collapse margin can be improved.

In this way, in the case where the surface of the semiconductor substrate 1 is cleaned, it is possible to prevent the collapse of the fine pattern during the drying treatment by the formation of a hydrophobic functional surface on the substrate surface.

Second Embodiment

Figure 5:
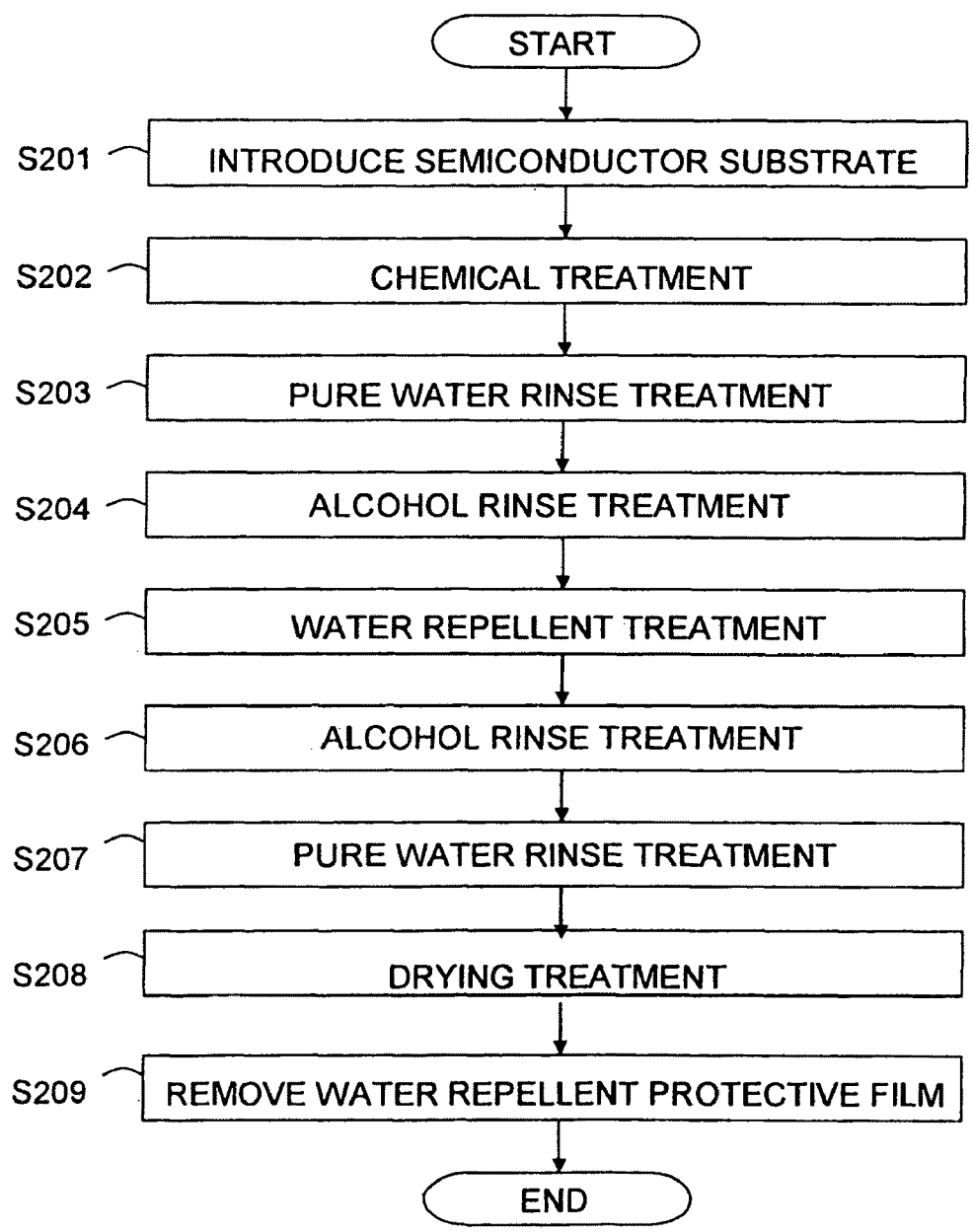
FIG. 5 is a flow chart for explaining a surface treatment method according to a second embodiment and a fifth embodiment.
Figure 6:
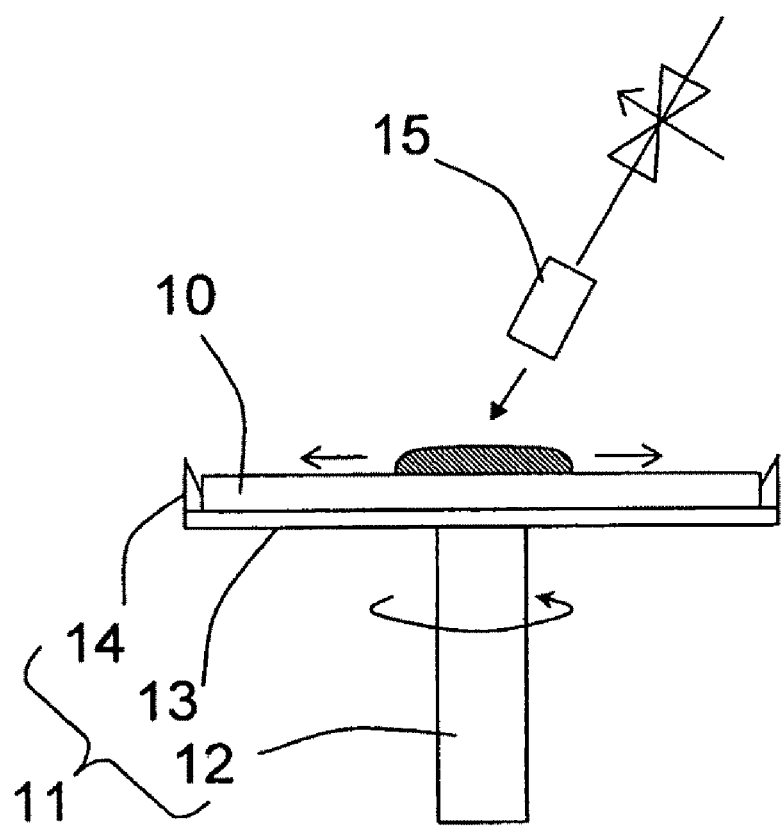
FIG. 6 is a figure showing a schematic configuration of a surface treatment apparatus according to the second embodiment and the fifth embodiment.

A method of treating the surface of a semiconductor substrate, according to a second embodiment of the present invention, will be described with reference to a flow chart shown in FIG. 5, and a cross sectional view of the main part of a surface treatment apparatus shown in FIG. 6. The surface treatment apparatus shown in FIG. 6 is a single wafer type which performs treatment of one semiconductor substrate at a time by supplying a treatment solution to the semiconductor substrate.

(Step S201) A patterned semiconductor substrate (wafer) 10 to be treated is carried in by a carrying section (not shown), and is delivered to a spin chuck 11. The spin chuck 11 is a substrate holding and rotating mechanism by which the semiconductor substrate 10 is substantially horizontally held and rotated.

The spin chuck 11 includes a rotating shaft 12 extended in substantially vertical direction, a disk-like spin base 13 attached to the upper end of the rotating shaft 12, and a chuck pin 14 which is provided at the periphery of the spin base 13 and is configured to hold the substrate.

(Step S202) The semiconductor substrate 10 is rotated at a predetermined rotation speed, and a chemical solution is supplied near the rotation center of the surface of the semiconductor substrate 10 from a nozzle 15 provided above the spin chuck 11. The chemical solution is, for example, an SPM.

The chemical solution is made to spread over the entire surface of the semiconductor substrate 10 by being subjected to the centrifugal force caused by the rotation of the semiconductor substrate 10, and thereby a chemical solution (cleaning) treatment of the semiconductor substrate 10 is performed.

(Step S203) Pure water is supplied near the rotation center of the surface of the semiconductor substrate 10 from the nozzle 15. The pure water is made to spread over the entire surface of the semiconductor substrate 10 by being subjected to the centrifugal force caused by the rotation of the semiconductor substrate 10. Thereby, a pure water rinse treatment is performed to wash away the chemical solution left on the surface of the semiconductor substrate 10 by the pure water.

(Step S204) Alcohol, such as IPA, is supplied near the rotation center of the surface of the semiconductor substrate 10 from the nozzle 15. The IPA is made to spread over the entire surface of the semiconductor substrate 10 by being subjected to the centrifugal force caused by the rotation of the semiconductor substrate 10. Thereby, an alcohol rinse treatment is performed to substitute the IPA for the pure water left on the surface of the semiconductor substrate 10.

(Step S205) A silane coupling agent is supplied near the rotation center of the surface of the semiconductor substrate 10 from the nozzle 15. The silane coupling agent includes, in the molecule, a hydrolyzable group having affinity and reactivity with an inorganic material, and an organic functional group capable of being chemically bonded to an organic material. For example, hexamethyldisilazane (HMDS), tetramethyl silyl diethylamine (TMSDEA), and the like, can be used as the silane coupling agent.

The silane coupling agent is made to spread over the entire surface of the semiconductor substrate 10 by being subjected to the centrifugal force caused by the rotation of the semiconductor substrate 10. Thereby, a protective film (a hydrophobic functional surface) with low wettability is formed on the surface of the semiconductor substrate 10.

A hydrophobic functional surface is formed by the occurrence of esterification reaction of the silane coupling agent. Therefore, the reaction may be promoted by increasing the temperature of the solution by performing an anneal treatment or by irradiating ultraviolet rays.

(Step S206) Alcohol, such as IPA, is supplied near the rotation center of the surface of the semiconductor substrate 10 from the nozzle 15. The IPA is made to spread over the entire surface of the semiconductor substrate 10 by being subjected to the centrifugal force caused by the rotation of the semiconductor substrate 10. Thereby, an alcohol rinse treatment is performed to substitute the IPA for the silane coupling agent left on the surface of the semiconductor substrate 10.

(Step S207) Pure water is supplied near the rotation center of the surface of the semiconductor substrate 10 from the nozzle 15. The pure water is made to spread over the entire surface of the semiconductor substrate 10 by being subjected to the centrifugal force caused by the rotation of the semiconductor substrate 10. Thereby, a pure water rinse treatment is performed to wash away the IPA left on the surface of the semiconductor substrate 10 with the pure water.

(Step S208) A drying treatment of the semiconductor substrate 10 is performed. For example, there is performed a spin dry treatment in which the semiconductor substrate 10 is dried in such a manner that the rotation speed of the semiconductor substrate 10 is increased to a predetermined spin dry rotation speed, so as to shake off the pure water left on the surface of the semiconductor substrate 10.

The pattern formed on the semiconductor substrate 10 is covered by a hydrophobic functional surface, and hence the contact angle $\theta$ of the fluid is made to become large (close to 90°). Thereby, since $\cos \theta$ approaches zero, the power which contributes to the pattern collapse, which is applied to the pattern during the drying treatment, is reduced, so that the pattern collapse can be prevented.

(Step S209) An ashing treatment, such as dry ashing and ozone gas treatments, is performed, so that a hydrophobic functional surface formed on the surface of the semiconductor substrate 10 is removed.

Even when the surface treatment of the semiconductor substrate is performed according to the present embodiment, the same effect as that of the above described first embodiment (see FIG. 4) can be obtained.

In this way, in the case where the surface of the semiconductor substrate 10 is cleaned, the collapse of fine pattern during the drying treatment can be prevented by forming a hydrophobic functional surface on the surface of the substrate.

In the present embodiment, the alcohol rinse treatment is performed (step S204, S206) before and after the forming process of a hydrophobic functional surface (step S205). This is because some types of silane coupling agents used at the time of forming a hydrophobic functional surface can't be substituted with pure water. Therefore, in the case where the silane coupling agent is a substance capable of being substituted with pure water, the alcohol rinse treatment can be eliminated.

Third Embodiment

Figure 7:
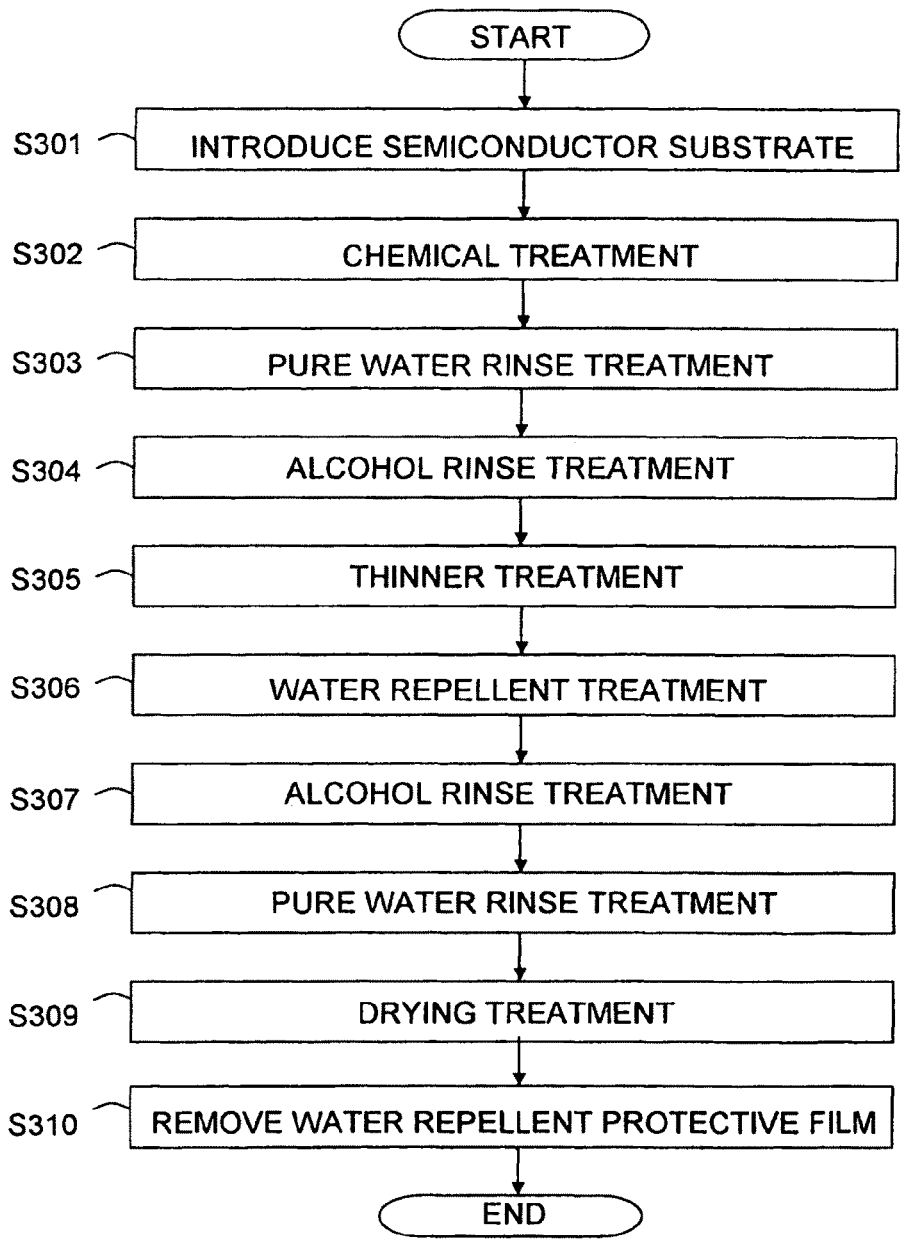
FIG. 7 is a flow chart for explaining a surface treatment method according to a third embodiment and a sixth embodiment.

A method of treating the surface of a semiconductor substrate, according to a third embodiment of the present invention, will be described with reference to a flow chart shown in FIG. 7. Further, it is assumed that there is used a batch type surface treatment apparatus which is the same as the surface treatment apparatus shown in FIG. 2 and which is configured to collectively clean and dry a plurality of semiconductor substrates.

(Step S301) The semiconductor substrate 1 is held by the substrate holding section 2, and is introduced into the treatment tank 3.

(Step S302) A chemical solution is supplied to the treatment tank 3 from a treatment chemical solution supplying section (not shown), so that the semiconductor substrate 1 is cleaned. As the chemical solution, there is used a mixed solution (SPM) of sulfuric acid and aqueous hydrogen peroxide.

(Step S303) Pure water is supplied into the treatment tank 3 from the treatment chemical solution supplying section. Thereby, the semiconductor substrate 1 is rinsed, so that components of the chemical solution used in step S302 are removed.

(Step S304) IPA (isopropyl alcohol) is supplied to the treatment tank 3 from the treatment chemical solution supplying section, so that an alcohol rinse treatment for substituting the pure water with the IPA is performed.

(Step S305) A thinner is supplied to the treatment tank 3 from the treatment chemical solution supplying section, so that the IPA is substituted with the thinner. For example, such as propylene glycol monomethyl ether acetate (PGMEA) and a cyclohexanone can be used as the thinner.

(Step S306) A silane coupling agent is supplied to the treatment tank 3 from the treatment chemical solution supplying section, so that a low wettability protective film (a hydrophobic functional surface) is formed on the surface of the semiconductor substrate 1.

As the silane coupling agent, it is possible to use, for example, Hexamethyldisilazane (HMDS), tetramethyl silyl diethylamine (TMSDEA), and the like. Further, the silane coupling agent may be diluted by using a thinner.

(Step S307) IPA is supplied to the treatment tank 3 from the treatment chemical solution supplying section, so that the silane coupling agent is substituted with the IPA.

(Step S308) Pure water is supplied to the treatment tank 3 from the treatment chemical solution supplying section, so that the IPA is substituted with the pure water.

(Step S309) A drying treatment of the semiconductor substrate 1 is performed. For example, the semiconductor substrate 1 is pulled up from the treatment tank 3, and is thereafter subjected to evaporation drying by supplying dry air from a gas supplying section (not shown). A reduced pressure drying method may also be used.

Further, the drying treatment may also be performed in such a manner that a drying chemical (IPA or the like) is supplied to the upper space of the treatment tank 3 from a drying chemical supplying section (not shown) in the form of liquid, vapor, or mist and in a non-mixed state or in a state mixed with a gas such as nitrogen, and that the level of the pure water, in which the semiconductor substrate 1 is immersed, is gradually lowered by draining the pure water. Further, the drying treatment may also be performed by using a solution with low surface tension, such as HFE.

A pattern formed on the semiconductor substrate 10 is covered with the water repellent protective film (a hydrophobic functional surface), and hence the contact angle θ of the fluid is made to become large (close to 90°). Thereby, since cos θ approaches zero, the power which contributes to the pattern collapse, which is applied to the pattern during the drying treatment, is reduced, so that the pattern collapse can be prevented.

(Step S310) An ashing treatment, such as dry ashing and ozone gas treatments, is performed, so as to remove the water repellent protective film (a hydrophobic functional surface) formed on the surface of the semiconductor substrate 1.

In this way, in the case where the surface of the semiconductor substrate 10 is cleaned, the collapse of fine pattern during the drying treatment can be prevented by forming the water repellent protective film (a hydrophobic functional surface) on the surface of the substrate.

It is known that when IPA or $H_2O$, each of which has a hydroxyl group, is added to the silane coupling agent used in the water repellent treatment (step S306), the hydrolysis of the silane coupling agent is caused so that the water repellent performance of the silane coupling agent is deteriorated. The deterioration of the water repellent performance reduces the effect of preventing the pattern collapse.

Thus, in the present embodiment, after the pure water rinse (step S303) and the IPA substitution (step S304) are performed, the thinner treatment (step S305) is performed before the water repellent treatment (step S306) is performed, so that the IPA is substituted by the thinner containing no hydroxyl group.

As a result, the water repellent performance of the silane coupling agent is not deteriorated, and thereby the pattern collapse can be prevented. In the case where the thinner can be substituted with water, the IPA substitution (step S304) can be eliminated. Further, like the above described second embodiment, in the case where the silane coupling agent is a substance capable of being substituted with pure water, the alcohol rinse treatment (step S307) can be eliminated.

The above described first and third embodiments are used in the batch type surface treatment apparatus, but can also be used in the single wafer type surface treatment apparatus. Similarly, the above described second embodiment is used in the single wafer type surface treatment apparatus, but can also be used in the batch type surface treatment apparatus.

In the above described embodiments, the ashing treatment for removing the water repellent protective film (a hydrophobic functional surface) is performed after the drying treatment of the semiconductor substrate. However, in the case where an RIE process is performed after the drying treatment, the ashing treatment need not be performed because the water repellent protective film (a hydrophobic functional surface) is also removed in the RIE process.

Note that the formation of the water repellent protective film (a hydrophobic functional surface) explained in the above described embodiments is to form a "protective film (a hydrophobic functional surface) exhibiting water repellency" on a "substance exhibiting hydrophilicity", such as for example an oxide film and a nitride film, which forms the surface of a base fine pattern. When the base fine pattern is made of poly-silicon, amorphous silicon, or the like, and when a hydrogen fluoride based chemical treatment is performed to the base fine pattern, the surface of the base fine pattern is made to become a hydrogen terminated water repellent state. In this case, the hydrogen fluoride based chemical treatment also corresponds to the water repellent protective film (a hydrophobic functional surface) forming process. In order to further improve the water repellency, it is possible to use the surfactant or the silane coupling agent, which are explained in the above described embodiments.

In order to prevent a pattern formed on a substrate from being collapsed, it is necessary to reduce the force (P expressed by the above described formula 1) applied to the pattern. Among the parameters in the above described formula 1, Space is a fixed parameter determined by the pattern dimension, and the wettability $\cos\theta$ is a fixed parameter determined by a relationship between the substance forming the fine pattern (surface) and the solution. In the conventional substrate treatment, attention is directed to the surface tension $\gamma$, and hence a fluid having a low value of the surface tension $\gamma$ is used to reduce the force applied to the pattern. However, there is a limit in lowering the surface tension $\gamma$, so that it is not possible to prevent the pattern collapse.

On the other hand, as described above, in the surface treatment method according to the embodiments of the invention, the pattern collapse can be prevented in such a manner that a water repellent protective film (a hydrophobic functional surface) is formed on the pattern surface, and that the force applied to the pattern during the drying treatment is made very small by controlling the wettability represented by a value of $\cos\theta$.

The surface treatment methods according to the above described embodiments are particularly effective for preventing the pattern collapse at the time of an aspect ratio of eight or more.

Fourth Embodiment

A method of treating the surface of a semiconductor substrate, according to a fourth embodiment of the present invention, will be described with reference to a flow chart shown in FIG. 1 and a sectional view of a main part of a surface treatment apparatus shown FIG. 2. The surface treatment apparatus shown in FIG. 2 is a batch type apparatus configured to collectively perform cleaning and drying of a plurality of semiconductor substrates.

(step S101) The semiconductor substrate 1 which has a plurality of convex shaped patterns in a predetermined region of a surface and held by the substrate holding portion 2 is introduce to the treatment tank 3. The convex shaped pattern is a line and space pattern or the like, and at least a part of the convex shaped pattern is formed by a film containing silicon. The convex shaped pattern is formed, for example, by reactive ion etching (RIE) method or the like.

(step S102) Chemical solution is supplied from a treatment chemical solution supply unit (not shown) to the treatment tank 3, whereby the semiconductor substrate 1 is washed. As the chemical solution, for example, mixed solution of sulfuric acid and hydrogen peroxide solution (SPM), standard clean 1 (SC-1) including ammonia hydrogen peroxide solution, and the like may be used. The impurity and the propellant fouling remaining on the surface of the semiconductor substrate 1 are removed by the cleaning.

(Step S103) The semiconductor substrate 1 is rinsed by supplying pure water from the treatment chemical solution supplying section to the treatment tank 3, so that components of the chemical solution used in step S102 are removed.

(Step S104) A surfactant (water soluble surfactant) is supplied to the treatment tank 3 from the treatment chemical solution supplying section, so that a low-wettability protective film (a hydrophobic functional surface) is formed on the surface of the semiconductor substrate 1. The surfactant is a substance having both a hydrophobic group and a hydrophilic group in the molecule.

In the case that the surface of the semiconductor substrate 1 is hydrophilic, hydrophilic group of an interfacial active agent is coupled with the substrate, and hydrophobic group is directed outwardly. As a result, the surface of the semiconductor substrate 1 becomes water repellant. On the other hand, in the case that the surface of the semiconductor substrate 1 is hydrophobic, the hydrophobic group of the interfacial active agent is coupled with the substrate, and the hydrophilic group is directed outwardly. As a result, the surface of the semiconductor substrate 1 becomes hydrophilic. Accordingly, it is preferable to oxidize the surface by using the chemical solution having an oxidizing effect, before forming the water repellant protection film by using the interfacial active agent. There is the SC-1 and the like as the chemical solution having the oxidizing effect.

Therefore, it is possible to wash and oxidize the convex shaped pattern surface by performing the process of the step S102 using the chemical solution having the oxidizing effect, and thus it is preferable to use chemical solution having the oxidizing effect in the step S102. More preferably, the cleaning process and the modifying process are separated. Accordingly, the cleaned surface is modified after cleaning the washed surface of the convex shaped fine pattern, and thus it is possible to further improve the modifying effect in comparison with the case using the chemical solution having the oxidizing effect. For example, there can be considered the case that the SPM is used as the washing chemical solution, and the SC-1 is used as the modifying chemical solution.

(Step S105) Pure water is supplied to the treatment tank 3 from the treatment chemical solution supplying section, so as to rinse-out the remaining surfactant.

In this case, the rinse-out means the process of removing the chemical solution component, the interfacial active agent or the like remaining on the semiconductor substrate 1 through the rinse process.

(Step S106) A drying treatment of the semiconductor substrate 1 is performed. For example, the semiconductor substrate 1 is pulled up from the treatment tank 3, and is thereafter subjected to evaporation drying by supplying dry air from a gas supplying section (not shown). A reduced pressure drying method may also be used.

Further, the drying treatment may also be performed in such a manner that a drying chemical (IPA or the like) is supplied to the upper space of the treatment tank 3 from a drying chemical supplying section (not shown) in the form of liquid, vapor, or mist and in a non-mixed state or in a state mixed with a gas such as nitrogen, and that the level of the pure water in which the semiconductor substrate 1 is immersed is gradually lowered by draining the pure water. Further, the drying treatment may also be performed by using a solution with low surface tension, such as HFE.

FIG. 3 shows a state where a part of patterns 4 formed on the semiconductor substrate 1 is wetted with a solution 5.

When the θ in the expression 1 comes close to 90 degree, the surface tension component in the vertical direction to the force caused by the capillary force can not be negligible. In this case, the force P applied to the pattern 4 is expressed by the formula:

$$P=2\times\gamma\times\cos\theta\cdot H/\text{Space}+\gamma\times\sin\theta \quad \text{(formula 2)}$$

where H is the height of the liquid surface, Space is the distance between the patterns 4, and γ is the surface tension of the liquid 5. The first term in the expression 2 represents the force caused by the capillary force, and the second term represents the force which the surface tension itself gives to the pattern.

It can be seen from the formula that when θ approaches 90°, cos θ approaches zero and hence the power P of the solution, which is applied to the pattern during the drying treatment, is reduced. Thereby, it is possible to prevent the pattern from being collapsed during the drying treatment.

In this case, the force represented by the second term can not be negligible when the θ comes close to 90 degree, and thus the angle at which the force applied to the pattern comes to zero is about 95 degree.

(Step S107) An ashing treatment, such as dry ashing and ozone gas treatments, is performed, so as to remove a hydrophobic functional surface formed on the surface of the semiconductor substrate 1.

Since the present embodiment is for washing and drying the surface of the semiconductor substrate, the cleaning process is finished by removing a hydrophobic functional surface. In this case, if a hydrophobic functional surface is removed in a process after this process, it is not necessary to remove a hydrophobic functional surface immediately after drying.

In this way, in the case where the surface of the semiconductor substrate 1 is cleaned, it is possible to prevent the collapse of the fine pattern during the drying treatment by the formation of the water repellent protective film (a hydrophobic functional surface) on the substrate surface.

Fifth Embodiment

A method of treating the surface of a semiconductor substrate, according to a fifth embodiment of the present invention, will be described with reference to a flow chart shown in FIG. 5, and a cross sectional view of the main part of a surface treatment apparatus shown in FIG. 6. The surface treatment apparatus shown in FIG. 6 is a single wafer type which performs treatment of one semiconductor substrate at a time by supplying a treatment solution to the semiconductor substrate.

(Step S201) A semiconductor substrate (wafer) 10 which has a plurality of convex shaped patterns in a predetermined region of a surface is carried in by a carrying section (not shown), and is delivered to a spin chuck 11. The spin chuck 11 is a substrate holding and rotating mechanism by which the semiconductor substrate 10 is substantially horizontally held and rotated. The convex shaped pattern is a line and space pattern or the like, and at least a part of the convex shaped pattern is formed by a film containing silicon. The convex shaped pattern is formed, for example, by reactive ion etching (RIE) method or the like.

The spin chuck 11 includes a rotating shaft 12 extended in substantially vertical direction, a disk-like spin base 13 attached to the upper end of the rotating shaft 12, and a chuck pin 14 which is provided at the periphery of the spin base 13 and is configured to hold the substrate.

(Step S202) The semiconductor substrate 10 is rotated at a predetermined rotation speed, and a chemical solution is supplied near the rotation center of the surface of the semiconductor substrate 10 from a nozzle 15 provided above the spin chuck 11. The chemical solution is, for example, an SPM The chemical solution is made to spread over the entire surface of the semiconductor substrate 10 by being subjected to the centrifugal force caused by the rotation of the semiconductor substrate 10, and thereby a chemical solution (cleaning) treatment of the semiconductor substrate 10 is performed.

(Step S203) Pure water is supplied near the rotation center of the surface of the semiconductor substrate 10 from the nozzle 15. The pure water is made to spread over the entire surface of the semiconductor substrate 10 by being subjected to the centrifugal force caused by the rotation of the semiconductor substrate 10. Thereby, a pure water rinse treatment is performed to wash away the chemical solution left on the surface of the semiconductor substrate 10 by the pure water.

(Step S204) Alcohol, such as IPA, is supplied near the rotation center of the surface of the semiconductor substrate 10 from the nozzle 15. The IPA is made to spread over the entire surface of the semiconductor substrate 10 by being subjected to the centrifugal force caused by the rotation of the semiconductor substrate 10. Thereby, an alcohol rinse treatment is performed to substitute the IPA for the pure water left on the surface of the semiconductor substrate 10.

(Step S205) A silane coupling agent is supplied near the rotation center of the surface of the semiconductor substrate 10 from the nozzle 15. The silane coupling agent includes, in the molecule, a hydrolyzable group having affinity and reactivity with an inorganic material, and an organic functional group capable of being chemically bonded to an organic material. For example, hexamethyldisilazane (HMDS), tetramethyl silyl diethylamine (TMSDEA), and the like, can be used as the silane coupling agent.

The silane coupling agent is made to spread over the entire surface of the semiconductor substrate 10 by being subjected to the centrifugal force caused by the rotation of the semiconductor substrate 10. Thereby, a protective film (a hydrophobic functional surface) with low wettability is formed on the A hydrophobic functional surface is formed by the occurrence of esterification reaction of the silane coupling agent. Therefore, the reaction may be promoted by increasing the temperature of the solution by performing an anneal treatment or by irradiating ultraviolet rays.

In this case, as is different from the developing process of the resist pattern, in the present embodiment, the treatment is performed, for example, on the fine pattern made of the silicon member after the cleaning process. For example, in the case of the silicon film such as a silicon nitride film, polysilicon or the like is used, the silylation reaction may be insufficient even if a silylation treatment is performed using silane coupling agent, and thus sufficient water repellant for suppressing collapse of the pattern may not be attained. However, in the present embodiment, it is possible to change the surface of the silicon material to the chemical oxide film of the silicon oxide by adding the treatment using the treating chemical solution containing the oxidizing agent capable of oxidizing the surface of the silicon material. Since the silylation treatment is performed thereafter, it is possible to improve the hydrophobic character after the silylation treatment.

Figure 8B:
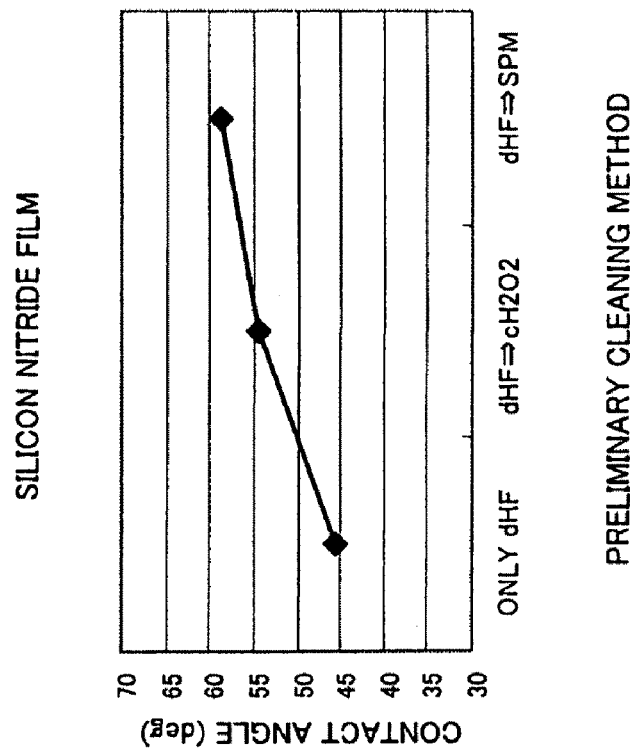
FIG. 8B is a graph illustrating a relation between cleaning sequence and a contact angle of water.
Figure 8A:
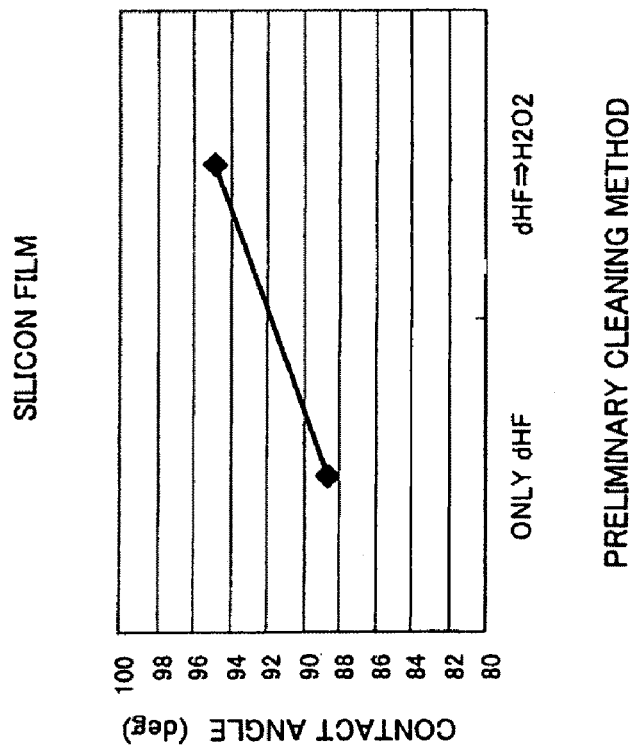
FIG. 8A is a graph illustrating a relation between cleaning sequence and a contact angle of water.

For example, in the case of the silicon film, if a hydrophobic functional surface is formed only by performing the dHF treatment, as shown in FIG. 8A, a contact angle of the water is 89 degree. If the $H_2O_2$ treatment is added thereto, the contact angle is improved to 95 degree. The reason is considered to be that a suitable oxide film is formed on the surface of the silicon film.

Further, in the case of the silicon nitride film, if the water repellant protective film (a hydrophobic functional surface) is formed only by performing the dHF treatment, as shown in FIG. 8B, a contact angle of the water is about 46 degree. If the $H_2O_2$ treatment is added thereto, the contact angle is improved to 54 degree, and if the SPM treatment is added, it is improved to 59 degree. The reason is considered to be that an appropriate modifying treatment is added in such a manner that the water repellant treatment is easily applied to the substrate surface after being washed, that is, silicon oxidation of the SiN surface is produced by the oxidizing agent and the water repellant film is easily formed.

Further, a lot of processing propellant fouling is generated after reactive ion etching (RIE) process. A hydrophobic functional surface is not easily formed in a state in which the processing propellant fouling is left. Therefore, it is effective for forming a hydrophobic functional surface, to remove the propellant fouling by the SPM treatment or the like. Further, the plasma damage is accumulated on the surface by the RIE process, and the dangling bond is generated. Accordingly, the dangling bond is modified with the OH radical by the modifying treatment using the chemical solution having the oxidizing effect. If a lot of OH radicals exist, the silylation reaction probability becomes high, and the aqueous protective film (a hydrophobic functional surface) is easily formed. Accordingly, it is possible to obtain the higher water repellency. In this embodiment, the effect can be obtained even if the fine pattern is the silicon oxide film.

In this case, in the description mentioned above, an example in which the surface of the semiconductor substrate 10 is modified by treatment chemical solution different from the washing chemical solution, after washing the semiconductor substrate 10. It is not necessary to separately perform the modifying treatment if the cleaning chemical solution also has the modifying effect, that is, the oxidizing effect. However, if the cleaning process and the modifying process are separately performed, the washed surface of the convex shaped fine pattern is cleaned and then the cleaned surface is modified, and thus it is possible to further improve the modifying effect in comparison with the case of using the chemical solution having the oxidizing effect. Accordingly, this is desirable.

(Step S206) Alcohol, such as IPA, is supplied near the rotation center of the surface of the semiconductor substrate 10 from the nozzle 15. The IPA is made to spread over the entire surface of the semiconductor substrate 10 by being subjected to the centrifugal force caused by the rotation of the semiconductor substrate 10. Thereby, an alcohol rinse treatment is performed to substitute the IPA for the silane coupling agent left on the surface of the semiconductor substrate 10.

(Step S207) Pure water is supplied near the rotation center of the surface of the semiconductor substrate 10 from the nozzle 15. The pure water is made to spread over the entire surface of the semiconductor substrate 10 by being subjected to the centrifugal force caused by the rotation of the semiconductor substrate 10. Thereby, a pure water rinse treatment is performed to wash away the IPA left on the surface of the semiconductor substrate 10 with the pure water.

(Step S208) A drying treatment of the semiconductor substrate 10 is performed. For example, there is performed a spin dry treatment in which the semiconductor substrate 10 is dried in such a manner that the rotation speed of the semiconductor substrate 10 is increased to a predetermined spin dry rotation speed, so as to shake off the pure water left on the surface of the semiconductor substrate 10.

(Step S209) An ashing treatment, such as dry ashing and ozone gas treatment, is performed, so that a hydrophobic functional surface formed on the surface of the semiconductor substrate 10 is removed. Furthermore, the ozone gas treatment can be performed during irradiating ultraviolet rays.

Since the present embodiment is for cleaning and drying the surface of the semiconductor substrate, the cleaning process is finished by removing a hydrophobic functional surface. In this case, if a hydrophobic functional surface is removed in a process after this process, it is not necessary to remove a hydrophobic functional surface immediately after drying.

As mentioned above, in the case that the surface treatment of the semiconductor substrate is performed according to the present embodiment, it is possible to prevent the convex shaped fine pattern from collapsing in the drying treatment by forming the water repellant protective film (a hydrophobic functional surface) on the substrate surface, upon washing the surface of the semiconductor substrate 10.

In the present embodiment, the alcohol rinse treatment is performed (step S204, S206) before and after the forming process of a hydrophobic functional surface (step S205). This is because some types of silane coupling agents used at the time of forming a hydrophobic functional surface can't be substituted with pure water. Therefore, in the case where the silane coupling agent is a substance capable of being substituted with pure water, the alcohol rinse treatment can be eliminated.

Sixth Embodiment

A method of treating the surface of a semiconductor substrate, according to a sixth embodiment of the present invention, will be described with reference to a flow chart shown in FIG. 8. Further, it is assumed that there is used a batch type surface treatment apparatus which is the same as the surface treatment apparatus shown in FIG. 2 and which is configured to collectively clean and dry a plurality of semiconductor substrates.

(Step S301) The semiconductor substrate 1 which has a plurality of convex shaped patterns in a predetermined region of a surface and held by the substrate holding portion 2 is introduce to the treatment tank 3. The convex shaped pattern is a line and space pattern or the like, and at least a part of the convex shaped pattern is formed by a film containing silicon. The convex shaped pattern is formed, for example, by reactive ion etching (RIE) method or the like.

(Step S302) A chemical solution is supplied to the treatment tank 3 from a treatment chemical solution supplying section (not shown), so that the semiconductor substrate 1 is cleaned. As the chemical solution, there is used a mixed solution (SPM) of sulfuric acid and aqueous hydrogen peroxide.

(Step S303) Pure water is supplied into the treatment tank 3 from the treatment chemical solution supplying section. Thereby, the semiconductor substrate 1 is rinsed, so that components of the chemical solution used in step S302 are removed.

(Step S304) IPA (isopropyl alcohol) is supplied to the treatment tank 3 from the treatment chemical solution supplying section, so that an alcohol rinse treatment for substituting the pure water with the IPA is performed.

(Step S305) A thinner is supplied to the treatment tank 3 from the treatment chemical solution supplying section, so that the IPA is substituted with the thinner. Propylene glycol monomethyl ether acetate (PGMEA) and a cyclohexanone can be used as the thinner.

(Step S306) A silane coupling agent is supplied to the treatment tank 3 from the treatment chemical solution supplying section, so that a low wettability protective film (a hydrophobic functional surface) is formed on the surface of the semiconductor substrate 1.

As the silane coupling agent, it is possible to use, for example, Hexamethyldisilazane (HMDS), tetramethyl silyl diethylamine (TMSDEA), and the like. Further, the silane coupling agent may be diluted by using a thinner.

In this embodiment also, the treatment is performed, for example, on the fine pattern made of the silicon nitride film or the silicon member after the washing process. Accordingly, also in the present embodiment, it is possible to improve the water repellant after the silylation treatment.

After the hydrophobic functional surface is formed, the thinner treatment may be performed. Due to the thinner treatment, an unreacted silane coupling agent can be rinsed off more effectively.

(Step S307) IPA is supplied to the treatment tank 3 from the treatment chemical solution supplying section, so that the silane coupling agent is substituted with the IPA.

(Step S308) Pure water is supplied to the treatment tank 3 from the treatment chemical solution supplying section, so that the IPA is substituted with the pure water.

(Step S309) A drying treatment of the semiconductor substrate 1 is performed. For example, the semiconductor substrate 1 is pulled up from the treatment tank 3, and is thereafter subjected to evaporation drying by supplying dry air from a gas supplying section (not shown). A reduced pressure drying method may also be used.

Further, the drying treatment may also be performed in such a manner that a drying chemical (IPA or the like) is supplied to the upper space of the treatment tank 3 from a drying chemical supplying section (not shown) in the form of liquid, vapor, or mist and in a non-mixed state or in a state mixed with a gas such as nitrogen, and that the level of the pure water, in which the semiconductor substrate 1 is immersed, is gradually lowered by draining the pure water. Further, the drying treatment may also be performed by using a solution with low surface tension, such as HFE.

(Step S310) An ashing treatment, such as dry ashing and ozone gas treatments, is performed, so as to remove the water repellent protective film (a hydrophobic functional surface) formed on the surface of the semiconductor substrate 1.

Since the present embodiment is for washing and drying the surface of the semiconductor substrate, the cleaning process is finished by removing a hydrophobic functional surface. In this case, if a hydrophobic functional surface is removed in a process after this process, it is not necessary to remove a hydrophobic functional surface immediately after drying.

As mentioned above, in the case that the surface treatment of the semiconductor substrate is performed according to the present embodiment, it is possible to prevent the convex shaped fine pattern from collapsing in the drying treatment by forming the water repellant protective film (a hydrophobic functional surface) on the substrate surface, upon cleaning the surface of the semiconductor substrate 10.

In the above described embodiments, the ashing treatment for removing a hydrophobic functional surface is performed after the drying treatment of the semiconductor substrate. However, in the case where an RIE process is performed after the drying treatment, the ashing treatment need not be performed because a hydrophobic functional surface is also removed in the RIE process.

Note that the formation of a hydrophobic functional surface explained in the above described embodiments is to form a "protective film (a hydrophobic functional surface) exhibiting water repellency" on a "substance exhibiting hydrophilicity", such as for example an oxide film and a nitride film, which forms the surface of a base fine pattern. When the base fine pattern is made of poly-silicon, amorphous silicon, or the like, and when a hydrogen fluoride based chemical treatment is performed to the base fine pattern, the surface of the base fine pattern is made to become a hydrogen terminated water repellent state. In this case, the hydrogen fluoride based chemical treatment also corresponds to a hydrophobic functional surface forming process. In order to further improve the water repellency, it is possible to use the surfactant or the silane coupling agent, which are explained in the above described embodiments.

In order to prevent a pattern formed on a substrate from being collapsed, it is necessary to reduce the force (P expressed by the above described formula 1) applied to the pattern. Among the parameters in the above described formula 1, Space is a fixed parameter determined by the pattern dimension, and the wettability cos θ is a fixed parameter determined by a relationship between the substance forming the fine pattern (surface) and the solution. In the conventional substrate treatment, attention is directed to the surface tension γ, and hence a fluid having a low value of the surface tension γ is used to reduce the force applied to the pattern. However, there is a limit in lowering the surface tension γ, so that it is not possible to prevent the pattern collapse.

On the other hand, as described above, in the surface treatment method according to the embodiments of the invention, the pattern collapse can be prevented in such a manner that a hydrophobic functional surface is formed on the pattern surface, and that the force applied to the pattern during the drying treatment is made very small by controlling the wettability represented by a value of cos θ.

The surface treatment methods according to the above described embodiments are particularly effective for preventing the pattern collapse at the time of an aspect ratio of eight or more.

Seventh Embodiment

A manufacturing method of a semiconductor device using the surface treatment method of the semiconductor substrate in accordance with the fourth to sixth embodiments is described hereinafter referring to process cross sectional views shown in FIGS. 9 to 17. Here, the description is given by exemplifying a processing of an element separating region of an STI structure in an NAND type flash memory.

Figure 9:
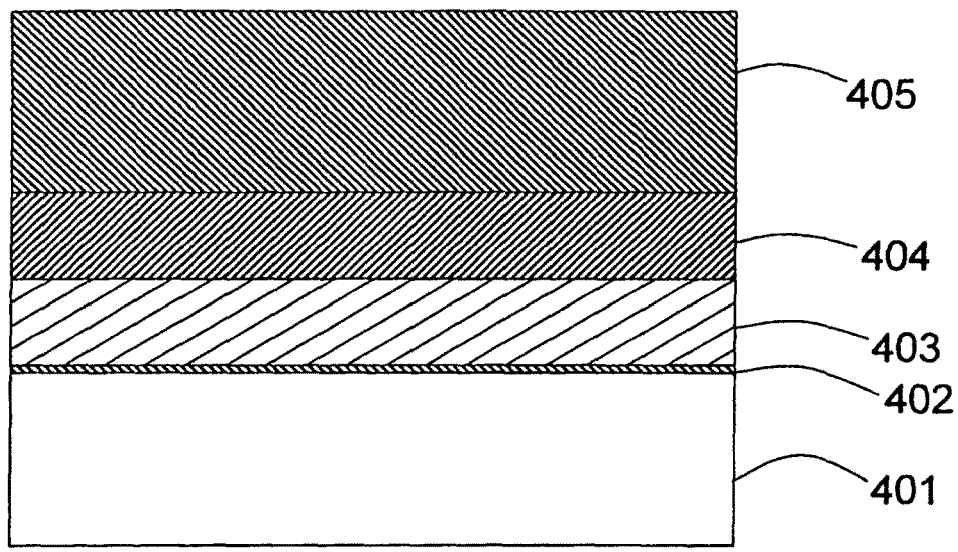
FIG. 9 is a cross-sectional view illustrating a manufacturing method for semiconductor device according to a seventh embodiment.

As shown in FIG. 9, on a silicon substrate 401, for example, a gate oxide film (silicon oxide film) 402 having a film thickness of 5 nm, a polysilicon film 403 having a film thickness of 100 nm, a silicon nitride film 404 having a film thickness of 100 nm, and a silicon oxide film 405 having a film thickness of 250 nm are laminated in this order. The polysilicon film 403 is arranged to be a floating gate electrode later.

Figure 10:
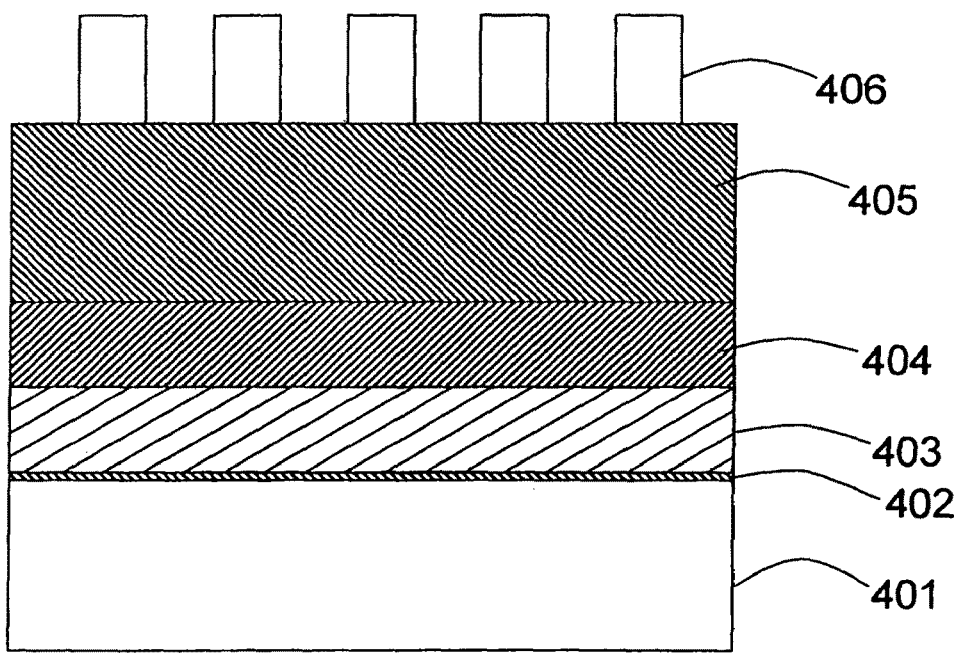
FIG. 10 is a cross-sectional view showing a step subsequent to FIG. 9.

As shown in FIG. 10, a resist layer 406 having a line/space pattern is formed on the silicon oxide film 405 by using photolithography technique. Line width and space width are, for example, 20 nm and 20 nm respectively. The line/space pattern is a pattern for forming an element separating regions, and is formed in parallel to a bit line direction.

Figure 11:
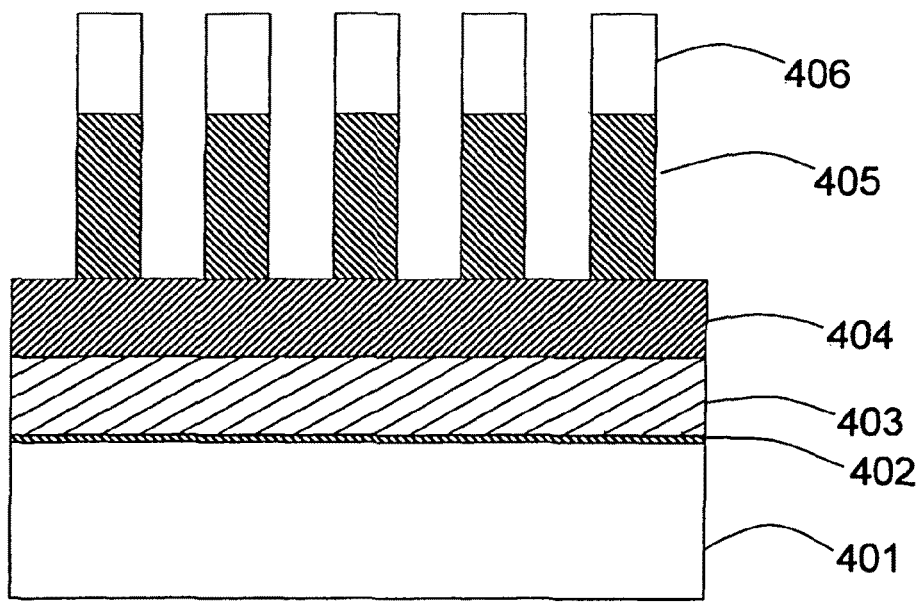
FIG. 11 is a cross-sectional view showing a step subsequent to FIG. 10.

As shown in FIG. 11, the silicon oxide film 405 is processed by the RIE by using the resist layer 406 as a mask. The silicon nitride film 404 serves as an etching stopper.

Figure 12:
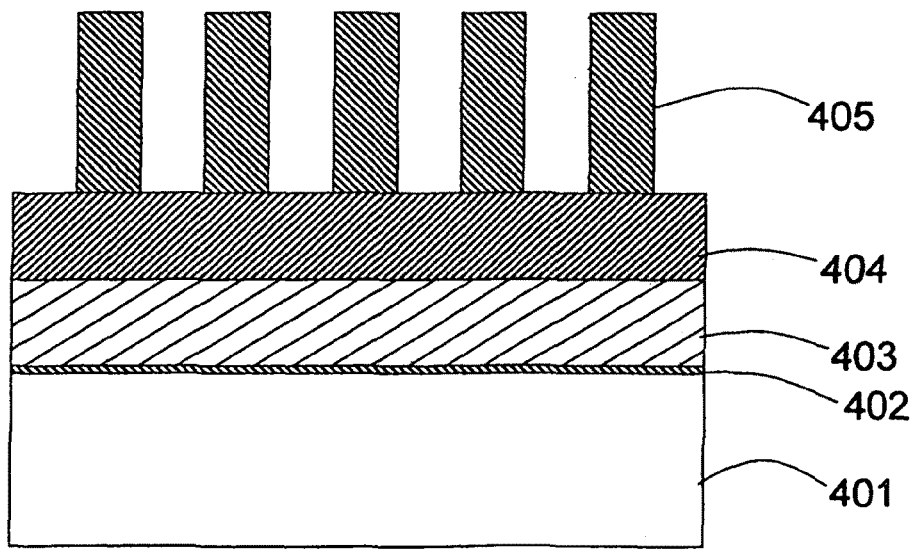
FIG. 12 is a cross-sectional view showing a step subsequent to FIG. 11.

As shown in FIG. 12, the resist layer 406 is removed, for example, by using an SPM (a mixed solution of sulfuric acid and hydrogen peroxide solution). For example, the substrate is dipped into the SPM having mixture ratio of $H_2SO_4$: $H_2O_2$=4:1, and at a temperature of 120° C. for ten minutes.

Subsequently, the SC-1 treatment is performed after rinsing out the SPM by using pure water. For example, the substrate is dipped into an ammonia hydrogen peroxide solution having mixture ratio of $NH_4OH$:$H_2O_2$:$H_2O$=1:1:5, and at a temperature of 60° C. for ten minutes.

Subsequently, the pure water is substituted by the IPA after rinsing out the SC-1 by the pure water.

Figure 13:
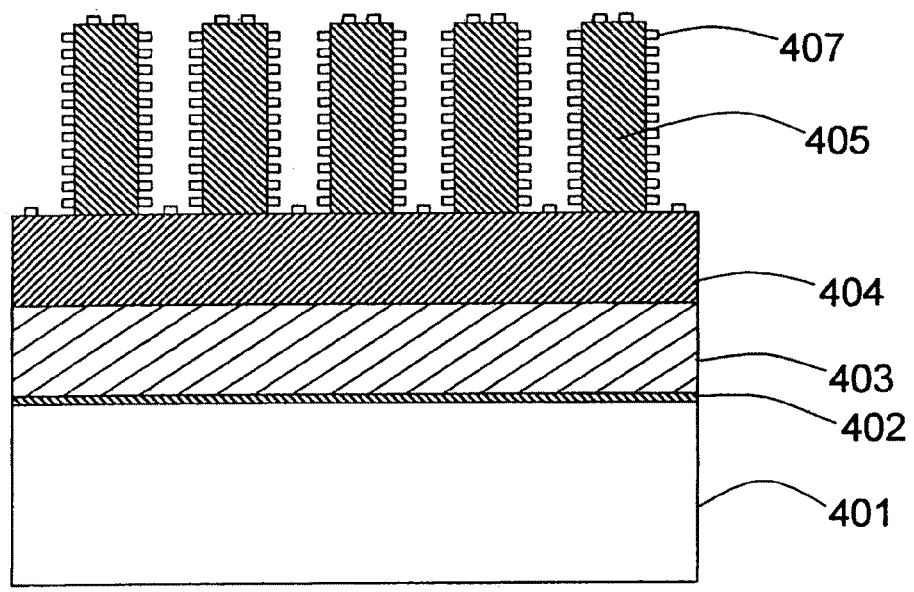
FIG. 13 is a cross-sectional view showing a step subsequent to FIG. 12.

As shown in FIG. 13, a water repellent protective film (a hydrophobic functional surface) 407 is formed on a pattern surface of the silicon oxide film 405, by using silane coupling agent. As the silane coupling agent, HMDS and TMSDEA or the like can be used. Since the pattern surface has been made to be OH radical rich state by the SPM treatment in the process shown in FIG. 12, the water repellant protective film (a hydrophobic functional surface) 407 is easily formed.

Further, since the pure water is substituted by the IPA in the process shown in FIG. 12, progress of hydrolysis along with the contact of the silane coupling agent with the pure water can be suppressed, and thus it is possible to prevent a reactive deterioration (deactivation). In the case that the used silane coupling agent is deactivated even by the contact with the IPA, it is preferable to further substitute the IPA by thinner.

Subsequently, the silane coupling agent is substituted by the IPA, and the IPA is further substituted by the pure water.

Thereafter, the substrate is dried by using a spin dry, a lifting dry or the like. Since the pattern surface is made high hydrophobic character by a hydrophobic functional surface 407, the surface tension becomes small, and thus it is possible to prevent the pattern from collapsing.

Figure 14:
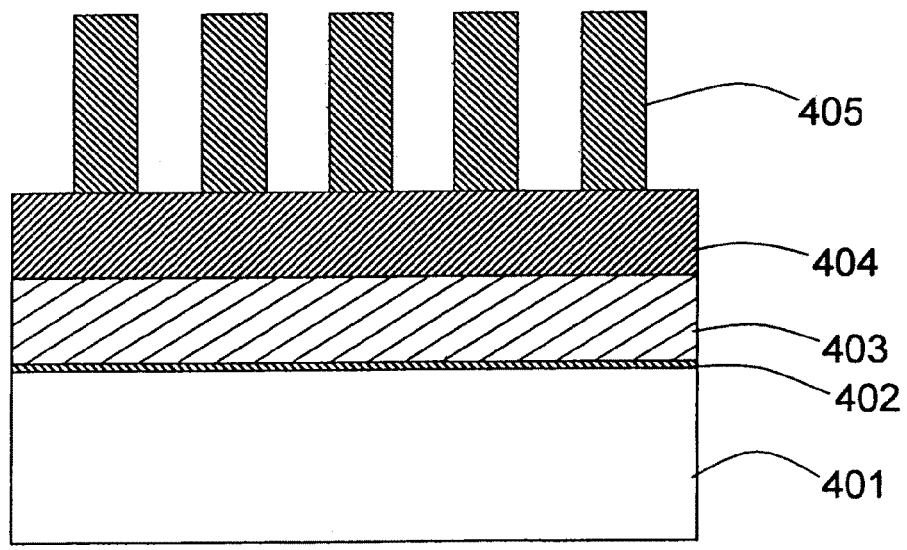
FIG. 14 is a cross-sectional view showing a step subsequent to FIG. 13.

As shown in FIG. 14, the water repellant protective film (a hydrophobic functional surface) 407 is removed by ozone ashing, baking, UV irradiation or the like so as to obtain the pattern surface in the clean state.

Figure 15:
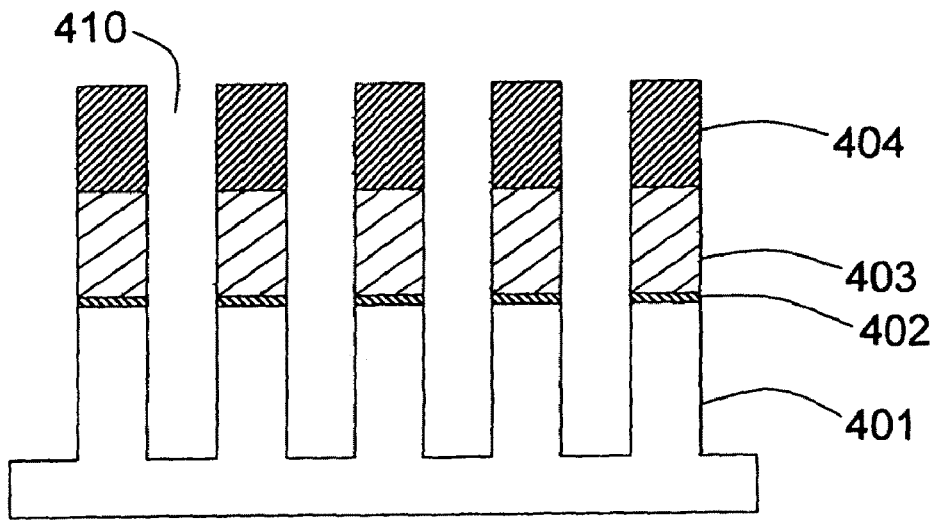
FIG. 15 is a cross-sectional view showing a step subsequent to FIG. 14.

As shown in FIG. 15, grooves 410 are formed by processing the silicon nitride film 404, the polysilicon film 403, the gate oxide film 402, and the silicon substrate 401 by the RIE using the silicon oxide film 405 (the hard mask). A processing depth is, for example, 200 nm. Subsequently, the silicon oxide film 405 is removed.

Next, the processing propellant fouling generated in the RIE treatment is removed by using a diluted hydrofluoric acid (dHF). Thereafter, the dHF is rinsed out by using the pure water.

Figure 16:
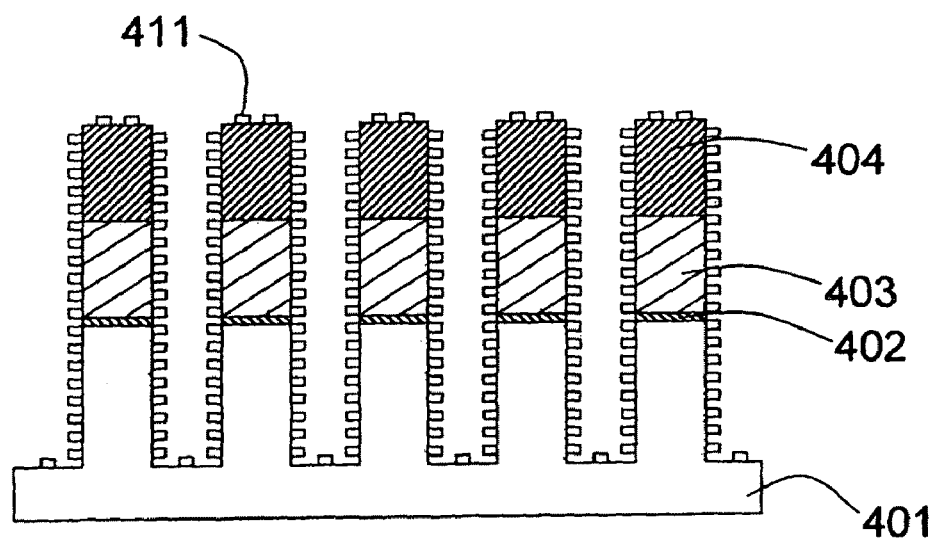
FIG. 16 is a cross-sectional view showing a step subsequent to FIG. 15.

As shown in FIG. 16, a water repellent protective film (a hydrophobic functional surface) 411 is formed on the surface of the grooves 410 by using the silane coupling agent or the surface active agent.

Subsequently, the silane coupling agent or the surface active agent used for forming the water repellant protective film (a hydrophobic functional surface) 411 is substituted by the pure water.

Thereafter, the substrate is dried by using the spin dry, the lifting dry, or the like. Since the pattern surface is made high water repellant by the water repellant protective film (a hydrophobic functional surface) 411, the surface tension becomes small, and thus it is possible to prevent the pattern from collapsing.

Figure 17:
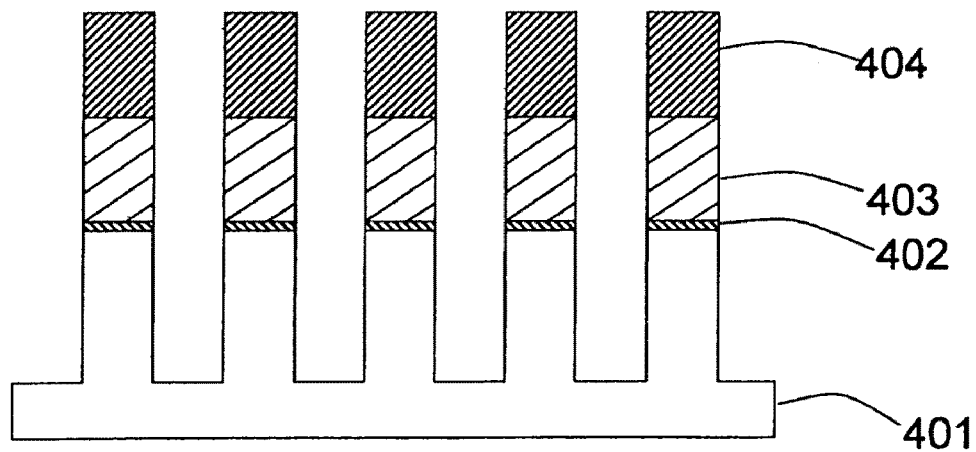
FIG. 17 is a cross-sectional view showing a step subsequent to FIG. 16.

As shown in FIG. 17, the water repellant protective film (a hydrophobic functional surface) 411 is removed by ozone ashing, baking, UV irradiation or the like so as to obtain the pattern surface in the clean state. Since the following processes are the same as those in the known method, a description thereof will not be made here.

As mentioned above, it is possible to prevent the pattern from collapsing in the drying process by water repellant treatment of the pattern surface upon washing the processed pattern, and thus it is possible to improve a manufacturing yield ratio.

In a process shown in FIG. 15, it is preferable to further perform the $H_2O_2$ treatment or the ozone water treatment after the dHF treatment. Since the Si surface is exposed on the surface of the dHF treated groove 410, the water repellent along with the formation of the water repellant protective film (a hydrophobic functional surface) 411 is improved by forming the thin oxide film by the $H_2O_2$ treatment or the ozone water treatment.

Eighth Embodiment

A manufacturing method of a semiconductor device using the surface treatment method of the semiconductor substrate in accordance with the fourth to sixth embodiments is described hereinafter referring to process cross sectional views shown in FIGS. 18 to 24. Whilst in the seventh embodiment, the polysilicon film, the silicon oxide film or the like is the subject to be processed, the case that the subject to be processed contains metal is described in the present embodiment.

Figure 18:
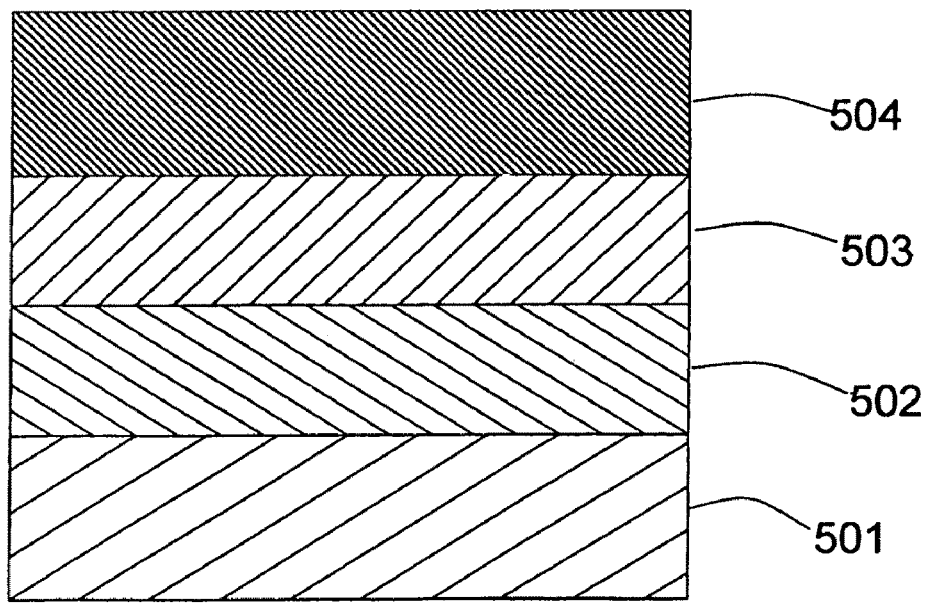
FIG. 18 is a cross-sectional view illustrating a manufacturing method for semiconductor device according to an eighth embodiment.

As shown in FIG. 18, on a wiring layer 501 made of a metal film, a metal layer 502, a polysilicon layer 503, and a silicon oxide film layer 504 are laminated in this order.

Figure 19:
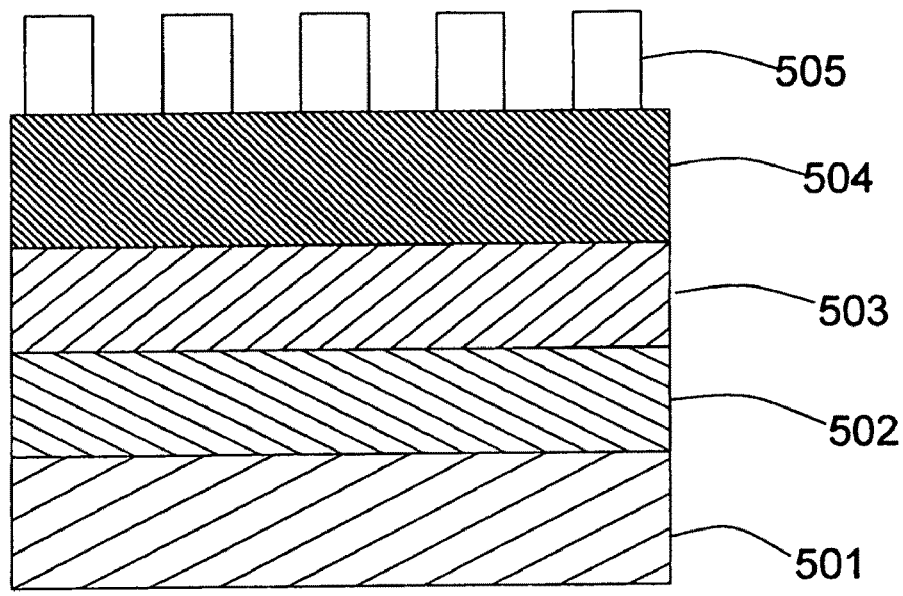
FIG. 19 is a cross-sectional view showing a step subsequent to FIG. 18.

As shown in FIG. 19, a resist layer 505 having a desired pattern is formed on the silicon oxide film layer 504 by using a photolithography technique.

Figure 20:
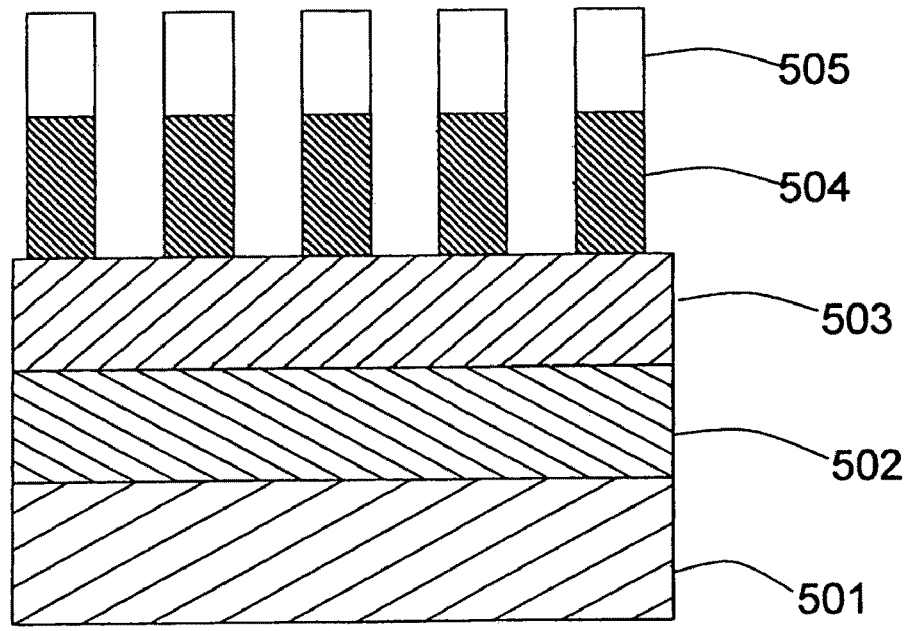
FIG. 20 is a cross-sectional view showing a step subsequent to FIG. 19.

As shown in FIG. 20, the silicon oxide film layer 504 is processed by the RIE, by using the resist layer 505 as a mask.

Figure 21:
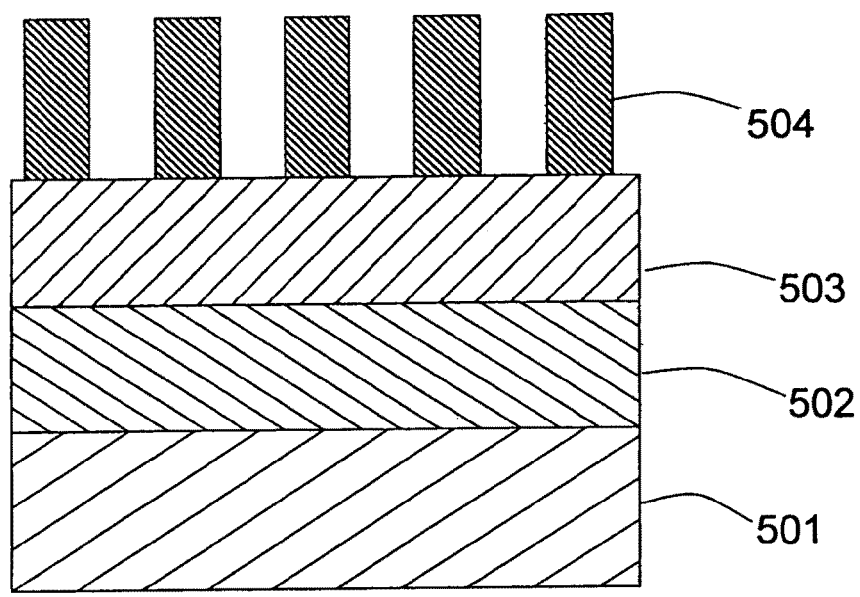
FIG. 21 is a cross-sectional view showing a step subsequent to FIG. 20.

As shown in FIG. 21, the resist layer 505 is removed by ashing process.

Figure 22:
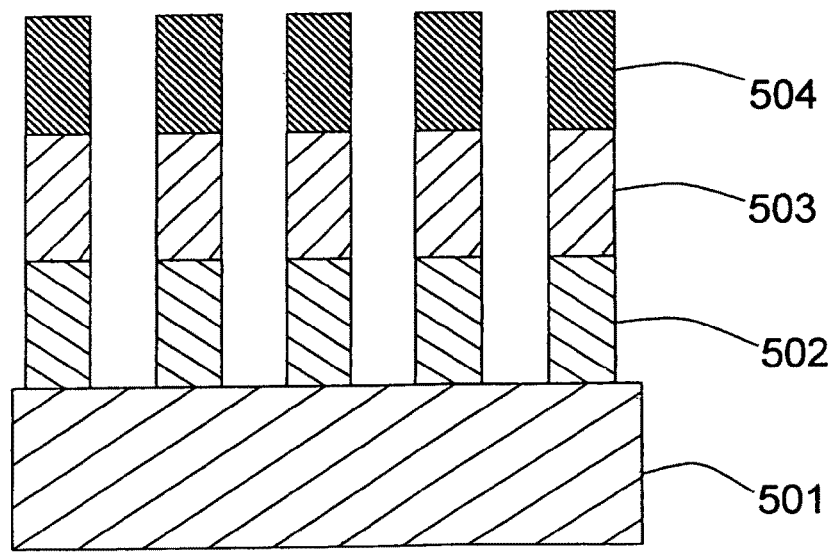
FIG. 22 is a cross-sectional view showing a step subsequent to FIG. 21.

As shown in FIG. 22, the polysilicon layer 503 and the metal layer 502 are processed by the RIE by using the silicon oxide film layer 504 as a mask.

Next, the processing propellant fouling generated in the RIE treatment is removed by using the chemical solution such as SPM, SC-1, SC-2, hydrofluoric acid or the like which is diluted to such a degree that does not affect the wiring layer 501 or the metal layer 502. Thereafter, the chemical solution is rinsed out by using the pure water.

Figure 23:
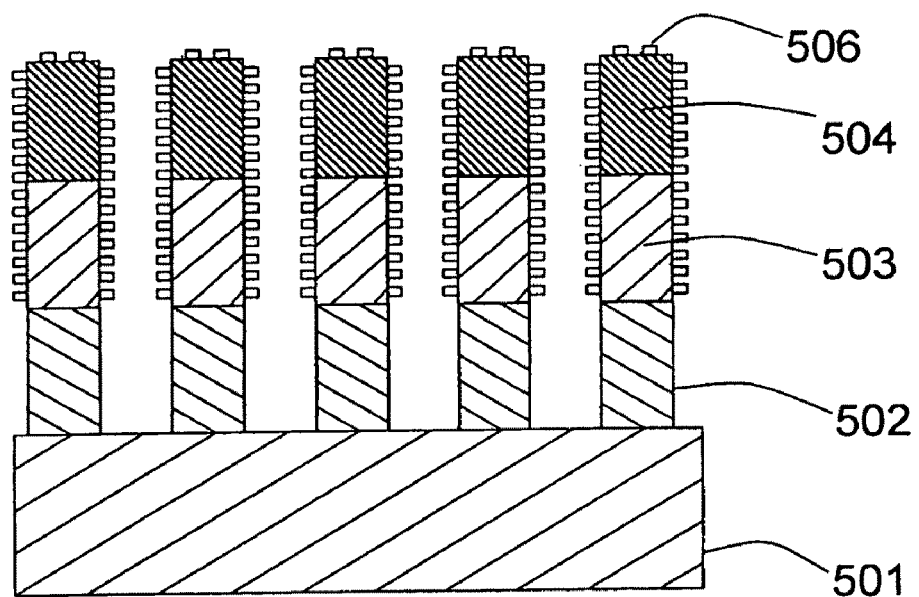
FIG. 23 is a cross-sectional view showing a step subsequent to FIG. 22.

As shown in FIG. 23, a hydrophobic functional surface 506 is formed on the surface of the silicon oxide film layer 504 and the polysilicon layer 503 by using the silane coupling agent or the surface active agent. In the case of using the chemical solution having the oxidizing effect such as the SPM, the SC-1, the SC-2 or the like in a process shown in FIG. 22, it is possible to achieve a higher hydrophobic state as described in FIG. 18.

Since the OH radical does not sufficiently exist on the surface of the wiring layer 501 and the metal layer 502, a hydrophobic functional surface 506 is hardly formed.

Subsequently, the silane coupling agent or the surface active agent used for forming a hydrophobic functional surface 506 is substituted by the pure water. The pure water substitution may be performed after the IPA substitution.

Thereafter, the substrate is dried by using the spin dry, the lifting dry or the like. Since the pattern surface is high water repellant by a hydrophobic functional surface 506, the surface tension and the capillary force become small, and it is possible to prevent the pattern from collapsing.

Further, in the case that the liquid surface is at a side of the metal layer 502 which is not hydrophobized, the height of the liquid surface is low and thus the capillary force becomes small. Therefore there is hardly a risk that the pattern collapses.

Figure 24:
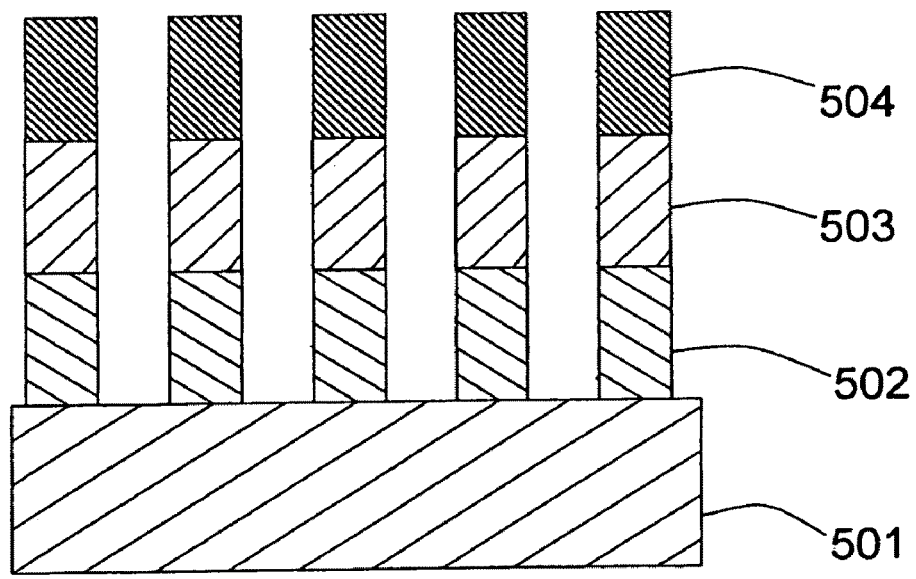
FIG. 24 is a cross-sectional view showing a step subsequent to FIG. 23.

As shown in FIG. 24, the water repellant protective film (a hydrophobic functional surface) 506 is removed by ozone ashing, baking, UV irradiation, or the like so as to obtain the pattern surface in the clean state.

As mentioned above, it is possible to prevent the pattern from collapsing by drying after applying the water repellant treatment after processing, even with respect to the pattern including the metal layer.

In the above embodiments, it is preferred that the water repellant protective film (hydrophobic functional surface) is formed on the surface of the convex patterns, but it is also effective in preventing the pattern collapse that a part of the surface of the convex patterns is modified.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of treating a semiconductor substrate comprising:
    forming convex patterns over the semiconductor substrate, each of the convex patterns including a silicon-containing film at least partly;
    cleaning and modifying a surface of the convex patterns by using chemical;
    forming a water repellent protective film on the modified surface of the convex patterns;
    after forming the water repellent protective film, rinsing the semiconductor substrate by using water;
    drying the semiconductor substrate; and
    removing the water repellent protective film, leaving the convex patterns.

2. The method of treating a semiconductor substrate according to claim 1, wherein the modifying is getting the surface of the convex patterns hydrophilic.

3. The method of treating a semiconductor substrate according to claim 2, wherein the modifying is hydroxylating the surface of the convex patterns.

4. The method of treating a semiconductor substrate according to claim 2, wherein the modifying is oxidizing the surface of the convex patterns.

5. The method of treating a semiconductor substrate according to claim 1, wherein the water repellent protective film is formed by using a surfactant.

6. The method of treating a semiconductor substrate according to claim 1, wherein the water repellent protective film is formed by using a silane coupling agent.

7. The method of treating a semiconductor substrate according to claim 6, further comprising:
    rinsing the semiconductor substrate by using alcohol at a timing of at least either one of: after forming the convex patterns and before forming the water repellent protective film; or after forming the water repellent protective film and before rinsing by using water.

8. The method of treating a semiconductor substrate according to claim 6, further comprising:
    rinsing the semiconductor substrate by using alcohol, and substituting the alcohol by thinner, after forming the convex patterns and before forming the water repellent protective film.

9. The method of treating a semiconductor substrate according to claim 1, wherein the silicon-containing film includes either one of polysilicon, silicon oxide, silicon nitride and amorphous silicon.

10. The method of treating the surface of a semiconductor substrate according to claim 1, wherein the semiconductor substrate is dried by using a spin dry method, an evaporation dry method or a depressurization dry method; or by using a solvent such as isopropyl alcohol or hydrofluoroether to substitute the pure water on the semiconductor substrate by the solvent and then evaporating and drying the solvent.

11. A method of treating a semiconductor substrate comprising:
    forming convex patterns over the semiconductor substrate, each of the convex patterns including a silicon-containing film at least partly;
    cleaning processing propellant fouling on a surface of the convex patterns by using first chemical;
    modifying the surface of the convex patterns by using second chemical;
    forming a water repellent protective film on the modified surface of the convex patterns;
    after forming the water repellent protective film, rinsing the semiconductor substrate by using water;
    drying the semiconductor substrate; and
    removing the water repellent protective film, leaving the convex patterns.

12. The method of treating a semiconductor substrate according to claim 11, wherein the modifying is getting the surface of the convex patterns hydrophilic.

13. The method of treating a semiconductor substrate according to claim 12, wherein the modifying is hydroxylating the surface of the convex patterns.

14. The method of treating a semiconductor substrate according to claim 12, wherein the modifying is oxidizing the surface of the convex patterns.

15. The method of treating a semiconductor substrate according to claim 11, wherein the water repellent protective film is formed by using a surfactant.

16. The method of treating a semiconductor substrate according to claim 11, wherein the water repellent protective film is formed by using a silane coupling agent.

17. The method of treating a semiconductor substrate according to claim 16, further comprising:
    rinsing the semiconductor substrate by using alcohol at a timing of at least either one of: after forming the convex patterns and before forming the water repellent protective film; or after forming the water repellent protective film and before rinsing by using water.

18. The method of treating a semiconductor substrate according to claim 16, further comprising:
    rinsing the semiconductor substrate by using alcohol, and substituting the alcohol by thinner, after forming the convex patterns and before forming the water repellent protective film.

19. The method of treating a semiconductor substrate according to claim 11, wherein the silicon-containing film includes either one of polysilicon, silicon oxide, silicon nitride and amorphous silicon.

20. The method of treating the surface of a semiconductor substrate according to claim 11, wherein the semiconductor substrate is dried by using a spin dry method, an evaporation dry method or a depressurization dry method; or by using a solvent such as isopropyl alcohol or hydrofluoroether to substitute the pure water on the semiconductor substrate by the solvent and then evaporating and drying the solvent.

21. A method of treating a semiconductor substrate comprising:
    forming convex patterns over the semiconductor substrate, each of the convex patterns including a silicon-containing film at least partly;
    modifying a surface of the convex patterns by using chemical;
    forming a water repellent protective film on the modified surface of the convex patterns;
    after forming the water repellent protective film, rinsing the semiconductor substrate by using water;
    drying the semiconductor substrate; and
    removing the water repellent protective film, leaving the convex patterns.

22. The method of treating a semiconductor substrate according to claim 21, wherein the modifying is getting the surface of the convex patterns hydrophilic.

23. The method of treating a semiconductor substrate according to claim 22, wherein the modifying is hydroxylating the surface of the convex patterns.

24. The method of treating a semiconductor substrate according to claim 22, wherein the modifying is oxidizing the surface of the convex patterns.

25. The method of treating a semiconductor substrate according to claim 21, wherein the water repellent protective film is formed by using a surfactant.

26. The method of treating a semiconductor substrate according to claim 21, wherein the water repellent protective film is formed by using a silane coupling agent.

27. The method of treating a semiconductor substrate according to claim 26, further comprising:
    rinsing the semiconductor substrate by using alcohol at a timing of at least either one of: after forming the convex patterns and before forming the water repellent protective film; or after forming the water repellent protective film and before rinsing by using water.

28. The method of treating a semiconductor substrate according to claim 26, further comprising:
    rinsing the semiconductor substrate by using alcohol, and substituting the alcohol by thinner, after forming the convex patterns and before forming the water repellent protective film.

29. The method of treating a semiconductor substrate according to claim 21, wherein the silicon-containing film includes either one of polysilicon, silicon oxide, silicon nitride and amorphous silicon.

30. The method of treating the surface of a semiconductor substrate according to claim 21, wherein the semiconductor substrate is dried by using a spin dry method, an evaporation dry method or a depressurization dry method; or by using a solvent such as isopropyl alcohol or hydrofluoroether to substitute the pure water on the semiconductor substrate by the solvent and then evaporating and drying the solvent.

* * * * *